(12) United States Patent
Kasai et al.

(10) Patent No.: US 9,344,637 B2
(45) Date of Patent: May 17, 2016

(54) IMAGE PROCESSING APPARATUS, IMAGING APPARATUS, IMAGE PROCESSING METHOD, AND PROGRAM

(75) Inventors: Masanori Kasai, Kanagawa (JP); Go Asayama, Kanagawa (JP)

(73) Assignee: Sony Corporation, Tokyo (JP)

( * ) Notice: Subject to any disclaimer, the term of this patent is extended or adjusted under 35 U.S.C. 154(b) by 40 days.

(21) Appl. No.: 14/131,221

(22) PCT Filed: Jun. 21, 2012

(86) PCT No.: PCT/JP2012/065825
§ 371 (c)(1),
(2), (4) Date: Mar. 21, 2014

(87) PCT Pub. No.: WO2013/008596
PCT Pub. Date: Jan. 17, 2013

(65) Prior Publication Data
US 2014/0267828 A1    Sep. 18, 2014

(30) Foreign Application Priority Data
Jul. 14, 2011  (JP) ................................. 2011-155921

(51) Int. Cl.
H04N 5/235       (2006.01)
H01L 27/146      (2006.01)
H04N 5/3745      (2011.01)
(Continued)

(52) U.S. Cl.
CPC ........ *H04N 5/2355* (2013.01); *H01L 27/14609* (2013.01); *H01L 27/14647* (2013.01); *H04N 5/2352* (2013.01); *H04N 5/2353* (2013.01);
(Continued)

(58) Field of Classification Search
CPC . H04N 5/2353; H04N 5/2352; H04N 5/2355; H04N 5/35554; H04N 5/35563
See application file for complete search history.

(56) References Cited

U.S. PATENT DOCUMENTS 5,455,621 A * 10/1995 Morimura .............. H04N 5/235
                                                348/221.1
7,777,804 B2 * 8/2010 Shan ...................... H04N 5/235
                                                250/208.1
(Continued)

FOREIGN PATENT DOCUMENTS

| JP | 2000-050151 | 2/2000 |
| JP | 2007-124137 | 5/2007 |
| JP | 2007-214832 | 8/2007 |
| JP | 2011-101180 | 5/2011 |

*Primary Examiner* — Ahmed A Berhan
(74) *Attorney, Agent, or Firm* — Wolf, Greenfield & Sacks, P.C.

(57) ABSTRACT

An apparatus and a method that can efficiently generate a wide dynamic range image to which each piece of pixel information of a high sensitivity pixel and a low sensitivity pixel is applied are realized. High sensitivity pixel information obtained by adding pixel values of a plurality of high sensitivity pixels and low sensitivity pixel information obtained by adding pixel values of a plurality of low sensitivity pixels are output as output pixel signals from pixels of different sensitivities from a pixel unit, these pixel information are combined in a pixel information combining unit, an output pixel value is determined, and an output image of a wide dynamic range is output. In the pixel information combining unit, a weight for the high sensitivity pixel information or the low sensitivity pixel information is changed according to brightness of a subject, weight addition of the high sensitivity pixel information and the low sensitivity pixel information is performed, a pixel value of an output image is determined, and the pixel value is output.

16 Claims, 28 Drawing Sheets

(51) Int. Cl.
*H04N 5/355* (2011.01)
*H04N 9/04* (2006.01)

(52) U.S. Cl.
CPC ....... *H04N 5/35581* (2013.01); *H04N 5/37457* (2013.01); *H04N 9/045* (2013.01)

(56) References Cited

U.S. PATENT DOCUMENTS 8,324,550 B2 * 12/2012 Lyu .................... H04N 5/35581
 250/208.1
2009/0109306 A1 * 4/2009 Shan et al. .................... 348/273

* cited by examiner

FIG. 17
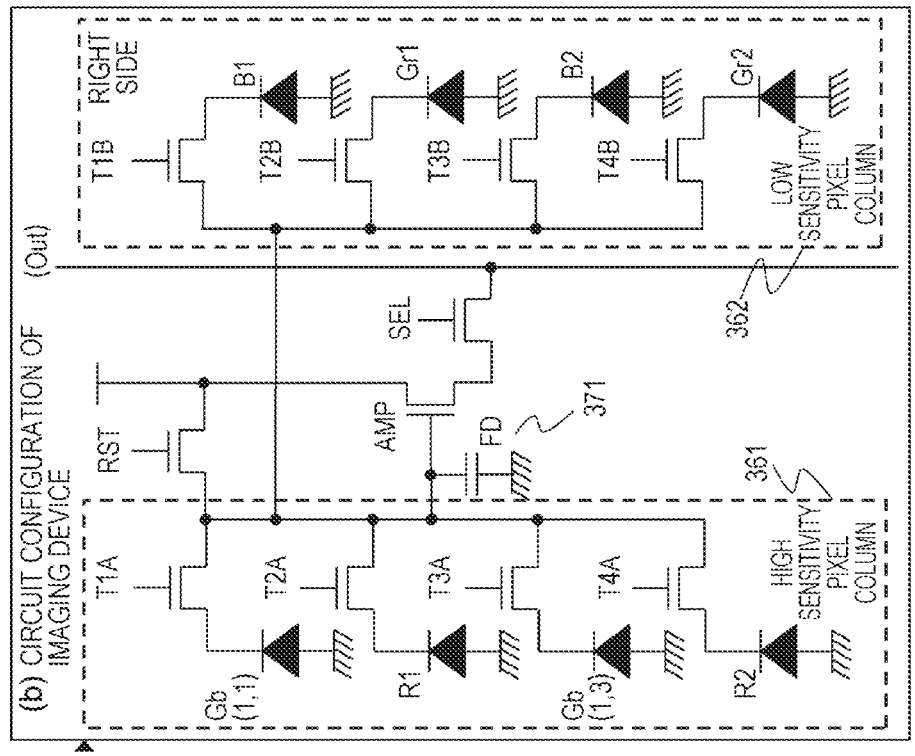
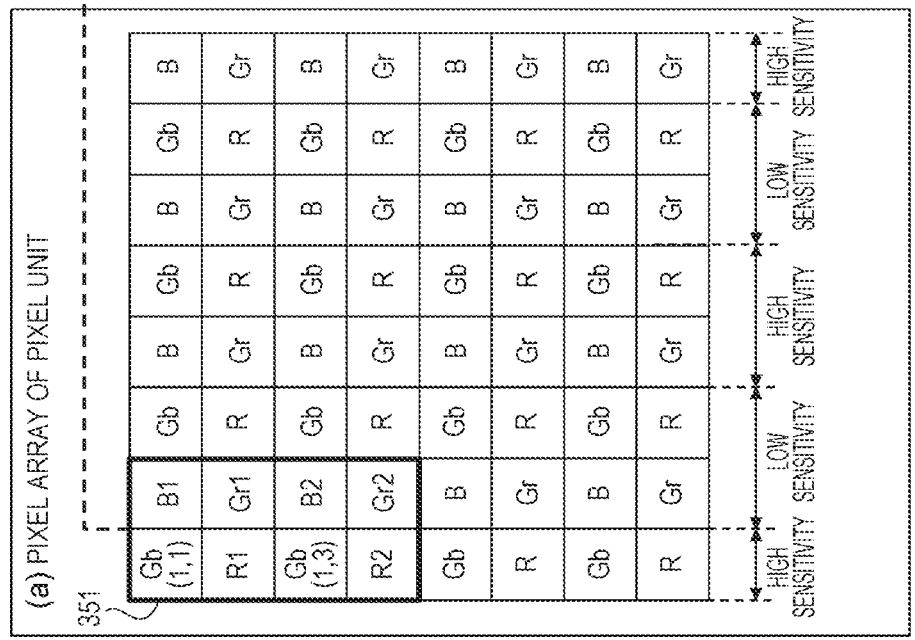

FIG. 24

PIXEL ARRAY (FILTER ARRAY)

| B | B | Gr | Gr | B | B | Gr | Gr |
|---|---|----|----|---|---|----|----|
| B | B | Gr | Gr | B | B | Gr | Gr |
| Gb | Gb | R | R | Gb | Gb | R | R |
| Gb | Gb | R | R | Gb | Gb | R | R |
| B | B | Gr | Gr | B | B | Gr | Gr |
| B | B | Gr | Gr | B | B | Gr | Gr |
| Gb | Gb | R | R | Gb | Gb | R | R |
| Gb | Gb | R | R | Gb | Gb | R | R |

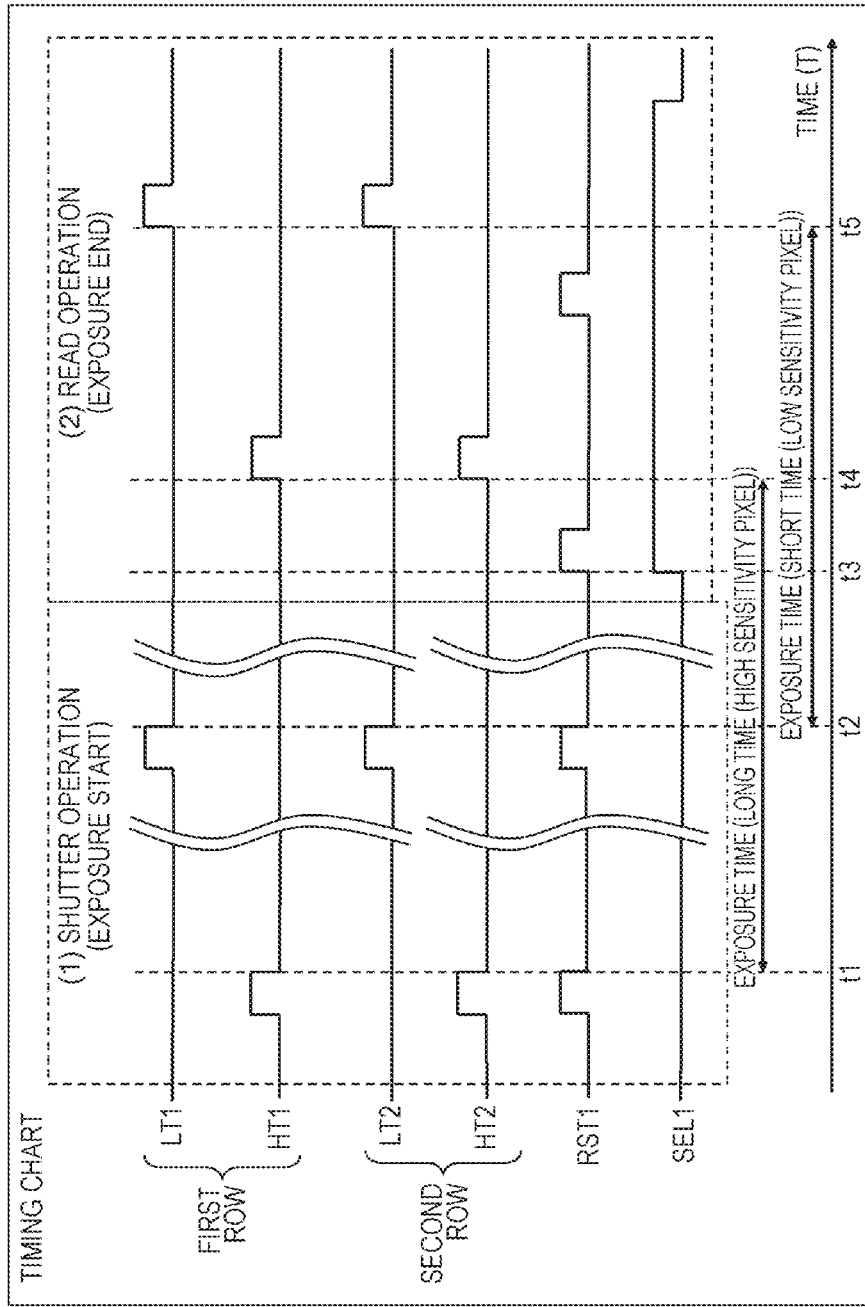

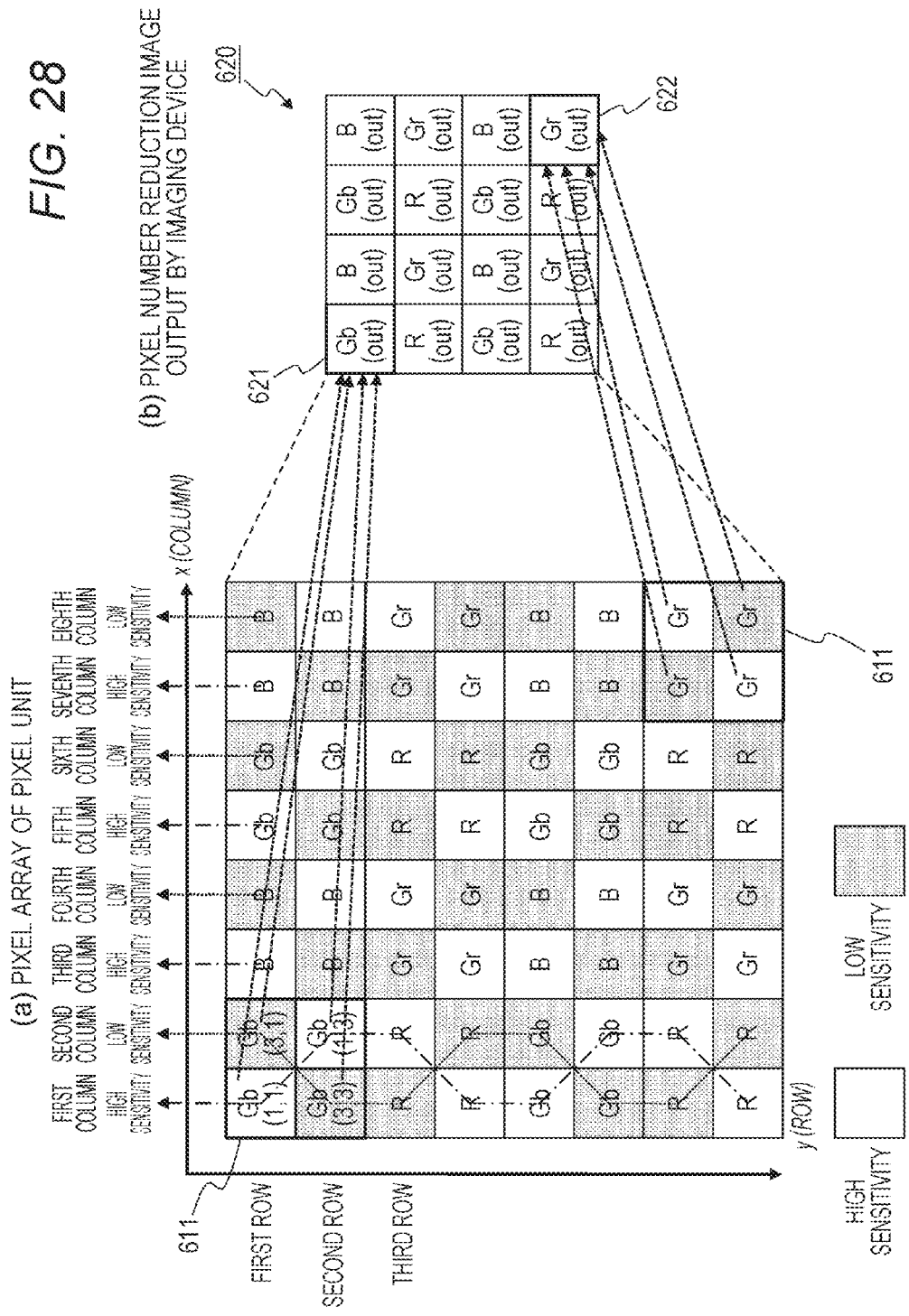

IMAGE PROCESSING APPARATUS, IMAGING APPARATUS, IMAGE PROCESSING METHOD, AND PROGRAM

CROSS REFERENCES TO RELATED APPLICATIONS

The present invention is the National Stage of International Application No. PCT/JP2012/065825, filed in the Japanese Patent Office as a Receiving Office on Jun. 21, 2012, which claims the priority benefit of Japanese Patent Application Number 2011-155921, filed in the Japanese Patent Office on Jul. 14, 2011, which is hereby incorporated by reference to the maximum extent allowable by law.

TECHNICAL FIELD

The present disclosure relates to an image processing apparatus, an imaging apparatus, an image processing method, and a program. In detail, the present disclosure relates to an image processing apparatus, an imaging apparatus, an image processing method, and a program that enable an image of a wide dynamic range to be generated.

BACKGROUND ART

Solid-state imaging devices such as a CCD image sensor or a complementary metal oxide semiconductor (CMOS) image sensor that are used in a video camera or a digital still camera perform photoelectric conversion for accumulating a charge according to an amount of incident light and outputting an electric signal corresponding to the accumulated charge. However, there is an upper limit in a charge accumulation amount in a photoelectric conversion element. If light of an amount equal to or more than a constant amount is received, so-called overexposure in which an accumulation charge amount reaches a saturation level and a brightness level of a subject region of constant brightness or more is set to a saturated brightness level may be generated.

To prevent such a phenomenon, a process for controlling a charge accumulation period in the photoelectric conversion element according to a change of external light, adjusting an exposure time, and controlling sensitivity to an optimal value is executed. For example, for a bright subject, a shutter is released fast to decrease an exposure time and decrease the charge accumulation period in the photoelectric conversion element and the electric signal is output before the accumulation charge amount reaches the saturation level. By this process, an output of an image in which a gradation according to a subject is exactly reproduced is enabled.

However, if the shutter is released fast in imaging of a subject in which a bright place and a dark place are mixed, a sufficient exposure time is not taken in a dark portion. For this reason, S/N is deteriorated and an image quality is lowered. As such, in an image obtained by imaging the subject in which the bright place and the dark place are mixed, exactly reproducing bright levels of a bright portion and a dark portion requires a process for increasing an exposure time and realizing high S/N in pixels in which incident light on an image sensor is small and avoiding saturation in pixels in which incident light is large.

As a method for realizing such a process, a method of continuously imaging a plurality of images having different exposure times and combining the plurality of images is known. That is, this method is a method of continuously and individually imaging a long time exposure image and a short time exposure image, executing a combination process using the long time exposure image for a dark image region and using the short time exposure image for a bright image region in which overexposure may be generated in the long time exposure image, and generating one image. As such, the plurality of different exposure images are combined, so that an image of a wide dynamic range not having the overexposure, that is, a wide dynamic range image (HDR image) can be obtained.

For example, Patent Document 1 (JP 2000-50151 A) discloses a configuration in which two images to which a plurality of different exposure times are set are imaged, these images are combined, and an image of a wide dynamic range is obtained. This process will be described with reference to FIG. 1. An imaging device outputs image data of two different exposure times in a video rate (30 to 60 fps), for example, when a moving image is imaged. In addition, when a still image is imaged, the imaging device generates image data of two different exposure times and outputs the image data. FIG. 1 is a diagram illustrating characteristics of images (a long time exposure image and a short time exposure image) that are generated by the imaging device and have two different exposure times. A horizontal axis shows a time (t) and a vertical axis shows an accumulation charge amount (e) in a light reception photodiode (PD) constituting a photoelectric conversion element corresponding to one pixel of a solid-state imaging element.

For example, in the case in which a light reception amount of the light reception photodiode (PD) is large, that is, the case of corresponding to a bright subject, as shown in a high brightness region 11 illustrated in FIG. 1, a charge accumulation amount increases rapidly over time. Meanwhile, in the case in which the light reception amount of the light reception photodiode (PD) is small, that is, the case of corresponding to a dark subject, as shown in a low brightness region 12 illustrated in FIG. 1, the charge accumulation amount increases moderately over time.

Times t0 to t3 correspond to an exposure time TL to acquire the long time exposure image. Even when the time is the exposure time TL of the long time, in a line shown in the low brightness region 12, a charge accumulation amount does not reach a saturation level at the time t3 (non-saturation point Py) and an exact gradation expression can be obtained by a gradation level of a pixel determined by using an electric signal obtained on the basis of a charge accumulation amount (Sa).

However, in a line shown in the high brightness region 11, it is clear for the charge accumulation amount to already reach the saturation level (saturation point Px), before reaching the time t3. Therefore, in the high brightness region 11, only a pixel value corresponding to the electric signal of the saturation level is obtained from the long time exposure image. As a result, pixels may become overexposure pixels.

Accordingly, in the high brightness region 11, an accumulation charge of the light reception photodiode (PD) is swept once at a time before reaching the time t3, for example, the time t1 (charge sweeping start point P1) illustrated in the drawing. The charge sweeping is performed to an intermediate voltage holding level controlled in the photodiode (PD), not for the entire charge accumulated in the light reception photodiode (PD). After a charge sweeping process, the short time exposure is performed again at the exposure time TS (t2 to t3). That is, the short time exposure of a period from the short time exposure start point P2 to a short time exposure end point P3 in the drawing is performed. A charge accumulation amount (Sb) is obtained by the short time exposure and a gradation level of a pixel is determined on the basis of an electric signal obtained on the basis of the charge accumulation amount (Sb).

When a pixel value is determined on the basis of the electric signal based on the charge accumulation amount (Sa) obtained by the long time exposure in the low brightness region 12 and the electric signal based on the charge accumulation amount (Sb) obtained by the short time exposure in the high brightness region 251, an estimated charge accumulation amount when the same time exposure is performed and an electric signal output value corresponding to the estimated charge accumulation amount are calculated and a pixel value level is determined on the basis of a calculated result.

As such, the short time exposure image and the long time exposure image are combined, so that an image of a wide dynamic range not having overexposure can be obtained.

However, in all of the configurations described in Patent Document 1, it is necessary to execute the process for individually imaging the long time exposure image and the short time exposure image and combining the long time exposure image and the short time exposure image.

As such, a wide dynamic range image (HDR image) can be generated by using the plurality of images in which the exposure times are changed. However, the following problems occur in the process based on the plurality of images.

Problem 1: imaging needs to be performed several times and a memory to store images needs to be provided.

Problem 2: because a plurality of images of which imaging timings are different are combined or imaging data of long time exposure is used, camera shaking is easily generated.

CITATION LIST

Patent Document

Patent Document 1: JP 2000-50151 A

SUMMARY OF THE INVENTION

Problems to be Solved by the Invention

The present disclosure has been made in view of the above circumstances and it is an object of the present disclosure to provide an image processing apparatus, an imaging apparatus, an image processing method, and a program that enable a wide dynamic range image to be generated on the basis of a one-time imaging image.

A first aspect of the present disclosure is an image processing apparatus including:

a control unit that executes exposure time control in units of pixels or pixel regions;

a pixel unit that outputs pixel information of a plurality of different exposure times by an imaging process under control of the control unit; and a pixel information combining unit that inputs the pixel information of the plurality of different exposure times output by the pixel unit, executes an operation process using the plurality of pixel information, and calculates a pixel value of an output image, wherein the pixel unit outputs high sensitivity pixel information obtained by adding pixel values of a plurality of high sensitivity pixels set on the basis of exposure control of the control unit and low sensitivity pixel information obtained by adding pixel values of a plurality of low sensitivity pixels, and the pixel information combining unit executes a weight addition process of the high sensitivity pixel information and the low sensitivity pixel information and calculates a pixel value of an output image.

Further, in an embodiment of the image processing apparatus according to the present disclosure, the control unit executes the exposure time control in units of columns of the pixel unit, and the pixel unit outputs high sensitivity pixel information obtained by adding pixel values of a plurality of different high sensitivity pixels of a high sensitivity pixel column in which long time exposure is performed and low sensitivity pixel information obtained by adding pixel values of a plurality of different low sensitivity pixels of a low sensitivity pixel column in which short time exposure is performed.

Further, in an embodiment of the image processing apparatus according to the present disclosure, the pixel information combining unit executes an addition process in which weights according to brightness of a subject are set to high sensitivity pixel information input from a long time exposure region and low sensitivity pixel information input from a short time exposure region, in a calculation process of the pixel value of the output image.

Further, in an embodiment of the image processing apparatus according to the present disclosure, when high sensitivity pixel information input from a long time exposure region is equal to or more than a predetermined threshold value, the pixel information combining unit calculates the pixel value of the output image by an operation process in which a weight of the high sensitivity pixel information is set to zero or a small value and only low sensitivity pixel information input from a short time exposure region is used or the weight is set to a large value.

Further, in an embodiment of the image processing apparatus according to the present disclosure, when low sensitivity pixel information input from a short time exposure region is less than a predetermined threshold value, the pixel information combining unit calculates the pixel value of the output image by an operation process in which a weight of the low sensitivity pixel information is set to zero or a small value and only high sensitivity pixel information input from a long time exposure region is used or the weight is set to a large value.

Further, in an embodiment of the image processing apparatus according to the present disclosure, the control unit executes exposure time control of units of columns, by shutter control of units of columns of the pixel unit.

Further, in an embodiment of the image processing apparatus according to the present disclosure, the control unit executes exposure time control in which a long time exposure region and a short time exposure region are alternately set in units of two columns of the pixel unit, and the pixel unit outputs high sensitivity pixel information obtained by adding pixel values of a plurality of pixels included in the longtime exposure region and low sensitivity pixel information obtained by adding pixel values of a plurality of pixels included in the short time exposure region.

Further, in an embodiment of the image processing apparatus according to the present disclosure, the image processing apparatus further includes: a gradation converter that executes a bit reduction process of a pixel value of each pixel of the output image generated by the pixel information combining unit.

Further, in an embodiment of the image processing apparatus according to the present disclosure, the image processing apparatus further includes: a signal processing unit that executes a signal process for the output image generated by the pixel information combining unit.

Further, in an embodiment of the image processing apparatus according to the present disclosure, the image processing apparatus further includes: a codec that executes an encoding process for the output image generated by the pixel information combining unit.

Further, in an embodiment of the image processing apparatus according to the present disclosure, the control unit executes exposure time control in units of pixels of the pixel unit, and the pixel unit outputs high sensitivity pixel information obtained by adding pixel values of a plurality of different high sensitivity pixels in which long time exposure is performed and low sensitivity pixel information obtained by adding pixel values of a plurality of different low sensitivity pixels in which short time exposure is performed.

Further, in an embodiment of the image processing apparatus according to the present disclosure, the pixel unit outputs high sensitivity pixel information obtained by adding pixel values of two high sensitivity pixels which are included in a 2×2 pixel region and in which the long time exposure is performed and outputs low sensitivity pixel information obtained by adding pixel values of two low sensitivity pixels which are included in the 2×2 pixel region and in which the short time exposure is performed.

Further, in an embodiment of the image processing apparatus according to the present disclosure, the pixel unit has a Bayer array.

Further, a second aspect of the present disclosure is an imaging apparatus including: an imaging unit; and an image processing unit that executes the process according to any of claims 1 to 11.

Further, a third aspect of the present disclosure is an image processing method that is executed in an image processing apparatus, including:

a control step of causing a control unit to execute exposure time control in units of pixels or pixel regions;

a pixel information output step of causing a pixel unit to output pixel information of a plurality of different exposure times by an imaging process under control of the control unit; and a pixel information combination step of causing a pixel information combining unit to input the pixel information of the plurality of different exposure times output by the pixel unit, execute an operation process using the plurality of pixel information, and calculate a pixel value of an output image, wherein the pixel information output step is a step of outputting high sensitivity pixel information obtained by adding pixel values of a plurality of high sensitivity pixels set on the basis of the exposure time control executed by the control unit and low sensitivity pixel information obtained by adding pixel values of a plurality of low sensitivity pixels, and the pixel information combination step is a step of executing a weight addition process of the high sensitivity pixel information and the low sensitivity pixel information and calculating a pixel value of an output image.

Further, a fourth aspect of the present disclosure is a program for causing an image process to be executed in an image processing apparatus, wherein a control step of causing a control unit to execute exposure time control in units of pixels or pixel regions, a pixel information output step of causing a pixel unit to output pixel information of a plurality of different exposure times by an imaging process under control of the control unit, and a pixel information combination step of causing a pixel information combining unit to input the pixel information of the plurality of different exposure times output by the pixel unit, execute an operation process using the plurality of pixel information, and calculate a pixel value of an output image are executed, in the pixel information output step, high sensitivity pixel information obtained by adding pixel values of a plurality of high sensitivity pixels set on the basis of the exposure time control executed by the control unit and low sensitivity pixel information obtained by adding pixel values of a plurality of low sensitivity pixels are output, and in the pixel information combination step, a weight addition process of the high sensitivity pixel information and the low sensitivity pixel information is executed and a pixel value of an output image is calculated.

Solutions to Problems

The program according to the present disclosure is a program that is provided by a storage medium with respect to an information processing apparatus or a computer/system that can execute various programs/codes. This program is executed by a program executing unit on the information processing apparatus or the computer/system, so that a process according to the program is realized.

Other objects, features, and advantages of the present disclosure will become apparent from the following detailed description based on embodiments of the present disclosure to be described later and the accompanying drawings. In the present specification, the system means a logical aggregate structure of a plurality of apparatuses and is not limited to a structure in which an apparatus of each configuration is in the same casing.

Effects of the Invention

According to one embodiment of the present disclosure, an apparatus and a method that can efficiently generate a wide dynamic range image to which each pixel information of a high sensitivity pixel and a low sensitivity pixel is applied are realized.

Specifically, high sensitivity pixel information obtained by adding pixel values of a plurality of high sensitivity pixels and low sensitivity pixel information obtained by adding pixel values of a plurality of low sensitivity pixels are output as output pixel signals from pixels of different sensitivities from a pixel unit, these pixel information are combined in a pixel information combining unit, an output pixel value is determined, and an output image of a wide dynamic range is output. In the pixel information combining unit, a weight for the high sensitivity pixel information or the low sensitivity pixel information is changed according to brightness of a subject, weight addition of the high sensitivity pixel information and the low sensitivity pixel information is performed, a pixel value of an output image is determined, and the pixel value is output.

According to one embodiment of the present disclosure, a plurality of pixels of different sensitivities are arranged in a pixel unit and pixel information in which resolution is lowered is generated from the plurality of pixels of the different sensitivities. As a result, a wide dynamic range image can be generated without needing a frame memory. In addition, because analog addition between the same sensitivities is enabled, a frame rate can be increased.

BRIEF DESCRIPTION OF DRAWINGS

FIG. 17 is a diagram illustrating a circuit configuration of a pixel unit of an imaging device in an image processing apparatus according to a third embodiment.

FIG. 24 is a diagram illustrating an example of a pixel array of a pixel unit.

FIG. 27 is a diagram illustrating a timing chart describing an imaging sequence in the image processing apparatus according to the sixth embodiment.

FIG. 28 is a diagram illustrating a specific example of a pixel array of the pixel unit and a pixel information combination process.

MODE FOR CARRYING OUT THE INVENTION

Hereinafter, an image processing apparatus, an imaging apparatus, an image processing method, and a program according to the present disclosure will be described in detail with reference to the drawings. The description is made according to the following items.
1. With respect to configuration example of imaging apparatus
2. With respect to a configuration example of imaging device
3. Other embodiments
　3-1. Second embodiment
　3-2. Third embodiment
　3-3. Fourth embodiment
　3-4. Fifth embodiment
　3-6. Sixth embodiment
4. Summary of configuration according to present disclosure
[1. With Respect to Configuration Example of Imaging Apparatus]

First, an entire configuration example of an imaging apparatus to be an example of an image processing apparatus according to the present disclosure will be described with reference to FIG. 2.

Figure 1:
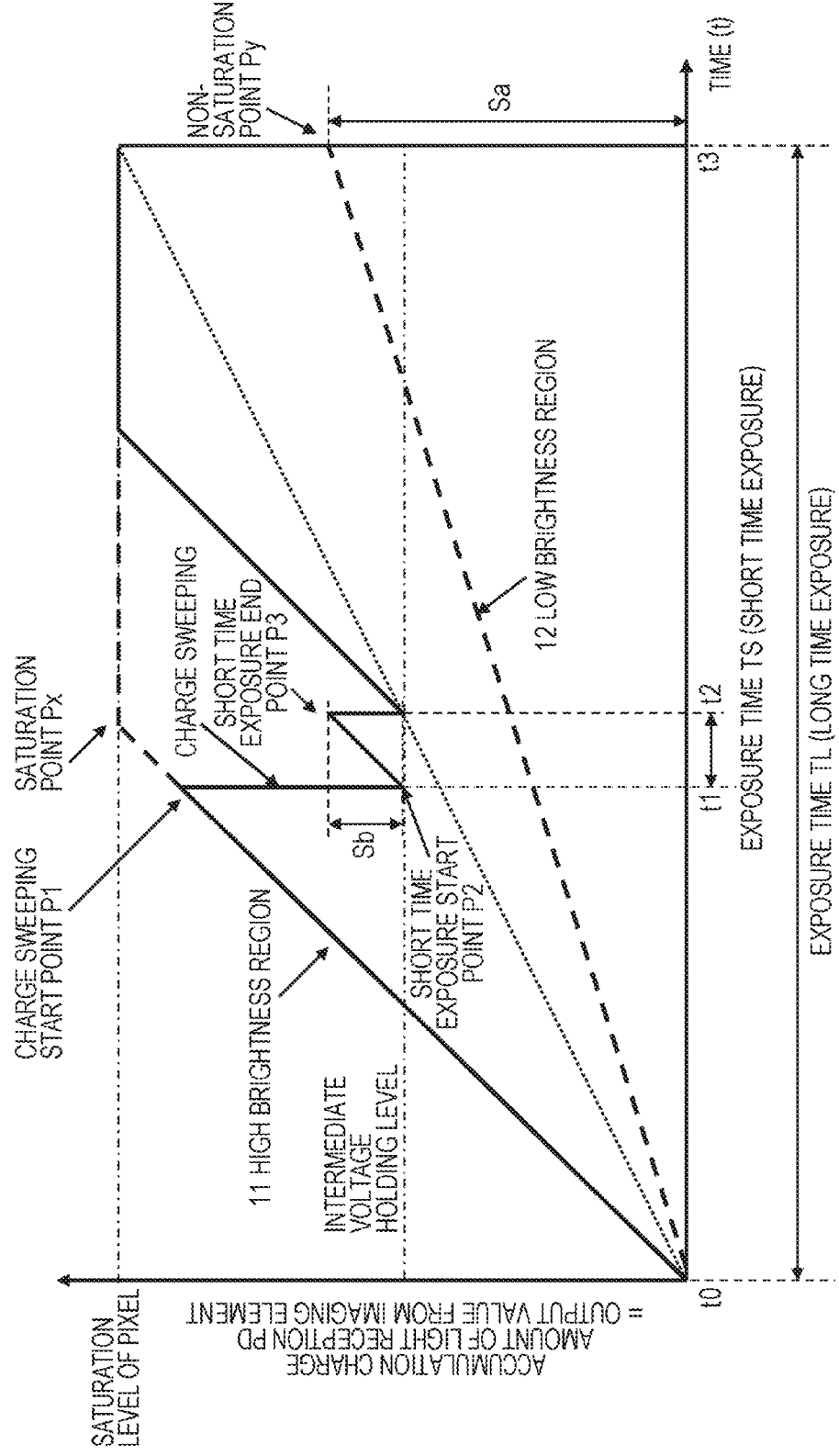
FIG. 1 is a diagram illustrating an imaging process example of a wide dynamic range image by a plurality of image imaging.
Figure 2:
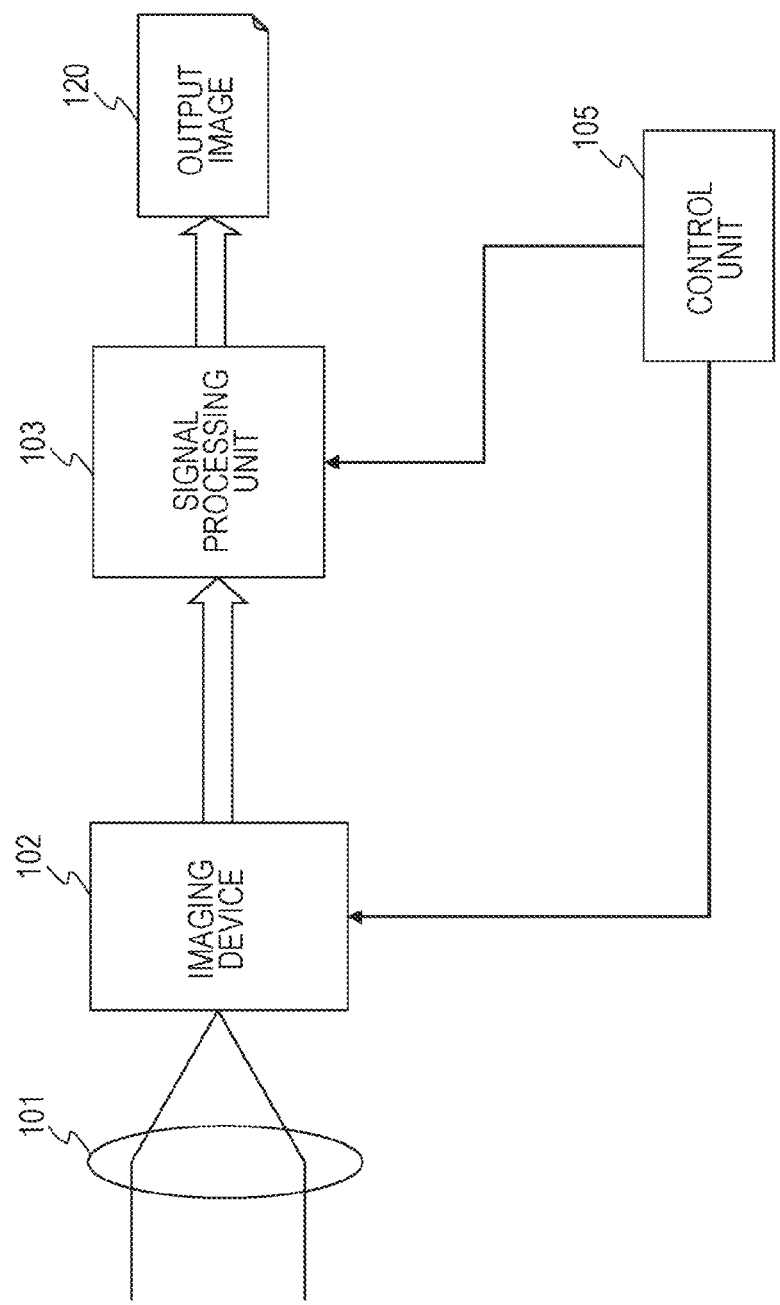
FIG. 2 is a diagram illustrating a configuration example of an imaging apparatus.

FIG. 2 is a block diagram illustrating a configuration example of an imaging apparatus. Light that is incident through an optical lens 101 is incident on an imaging device 102 configured by an imaging unit, for example, a CMOS image sensor and image data obtained by photoelectric conversion is output. The output image data is input to a signal processing unit 103. The signal processing unit 103 executes a signal process in a general camera such as white balance (WB) adjustment and gamma correction and generates an output image 120. The output image 120 is stored in a storage unit not illustrated in the drawings. Or, the output image 120 is output to a display unit.

A control unit 105 outputs a control signal to each unit according to a program stored in a memory not illustrated in the drawings and controls various processes.
[2. With Respect to Configuration Example of Imaging Device]

Next, a configuration example of the imaging device 102 will be described with reference to FIG. 3.

Figure 3:
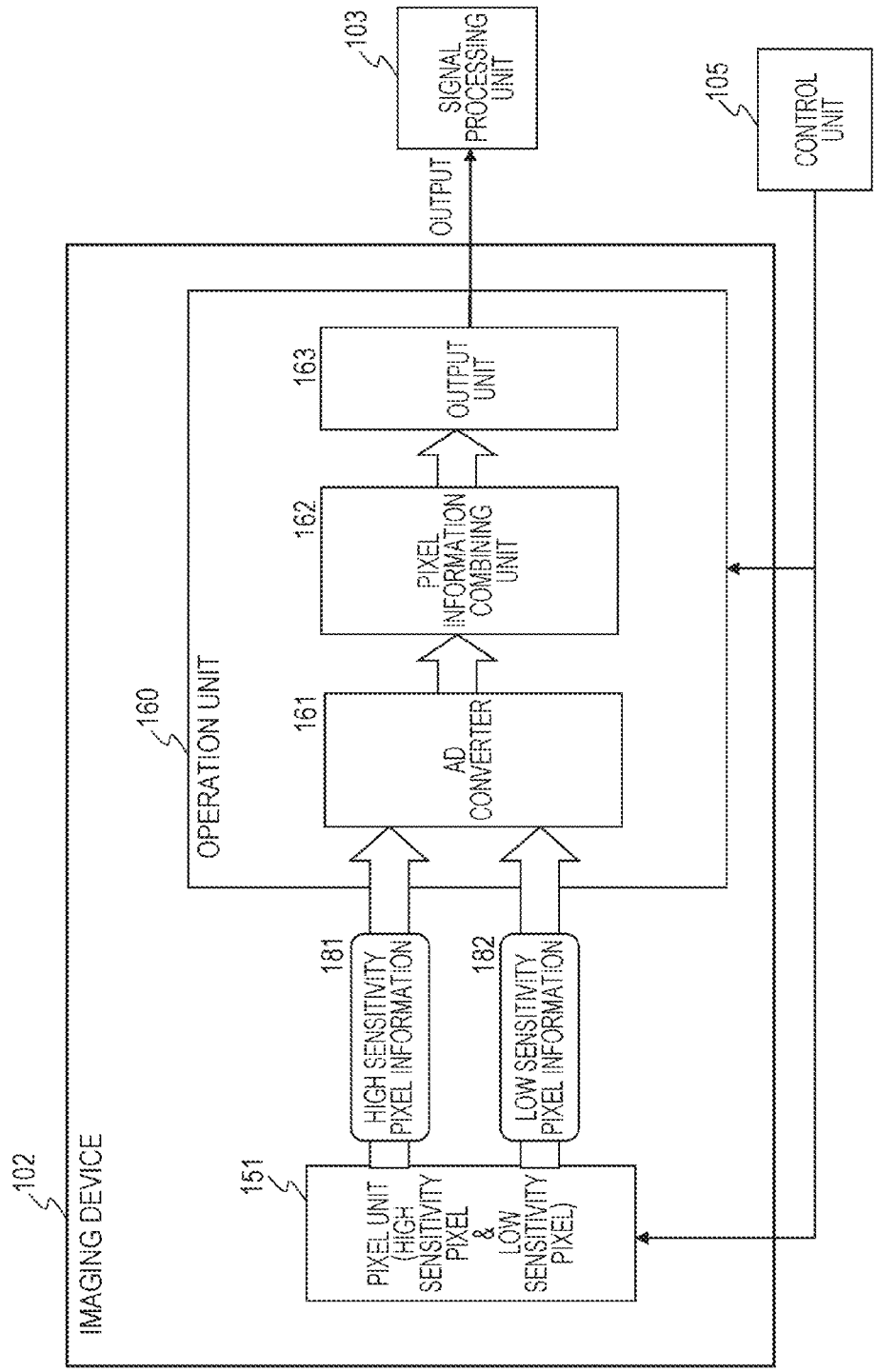
FIG. 3 is a diagram illustrating a configuration and a process example of an imaging device.

FIG. 3 is a diagram illustrating a configuration of the imaging device 102 according to an embodiment of the present disclosure.

The imaging device 102 has a pixel unit 151 and an operation unit 160 as illustrated in FIG. 3.

The operation unit 160 has an AD converter 161, a pixel information combining unit 162, and an output unit 163.

The operation unit 160 may have a configuration on the same chip as the pixel unit 151, that is, a configuration set in an on-chip or a configuration set in a chip or a device different from the pixel unit 151.

The pixel unit 151 accumulates a charge based on subject light in each of multiple pixels and outputs image data of a high pixel number to be a high resolution image.

In addition, the pixel unit 151 is configured to have high sensitivity pixels to perform long time exposure and low sensitivity pixels to perform short time exposure.

A configuration of the pixel unit 151 and a configuration example of an output image generated by a process of the operation unit 160 in the imaging device 102 will be described with reference to FIG. 4.

Figure 4:
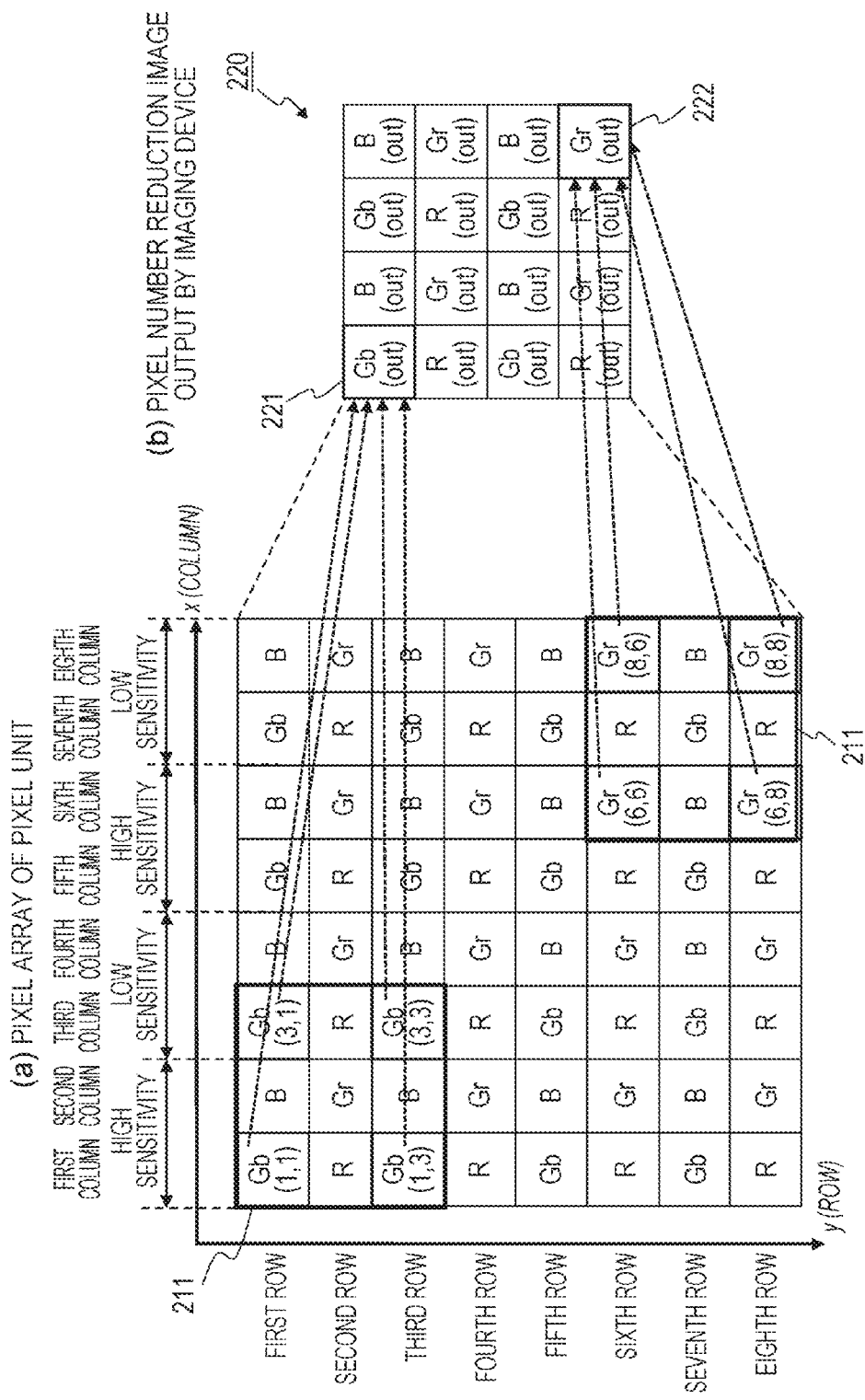
FIG. 4 is a diagram illustrating a specific example of an image information combination process.

As illustrated in FIG. 4 (a), the pixel unit 151 has a Bayer array composed of an RGbGrB array.

An exposure time of the pixel unit 151 is controlled in units of pixels by control of the control unit 105 and pixels of the pixel unit 151 are divided into two kinds of pixels, that is, high sensitivity pixels to which a long exposure time is set and low sensitivity pixels to which a short exposure time is set.

The high sensitivity pixels and the low sensitivity pixels are alternately set in units of two columns, according to a line of the vertical direction, as illustrated in the drawing.

As illustrated in FIG. 4(a), the horizontal direction and the vertical direction are set as (x) and (y), respectively, and a column number and a row number are represented by x coordinates and y coordinates, respectively.

The operation unit 160 of the imaging device 102 inputs high sensitivity pixel information and low sensitivity pixel information, combines the pixel information of the different sensitivities, and sets one pixel value of an output image.

In an example illustrated in FIG. 4, the case in which one pixel information is output from four pixels having two kinds of sensitivities is illustrated. That is, the imaging device 102 generates an image obtained by reducing the original number of pixels of the pixel unit 151 by ¼, that is, a pixel number reduction image 220 illustrated in FIG. 4(b) and outputs the image.

High sensitivity pixel information 181 and low sensitivity pixel information 182 are input from the pixel unit 151 to the operation unit 160 of the imaging device 102 illustrated in FIG. 3.

The AD converter 161 of the operation unit 160 executes A/D conversion, that is, a process for converting an analog signal into a digital signal, with respect to input signals, and digital values after the conversion are input to the information combining unit 162.

In the pixel information combining unit 162, for example, as illustrated in FIG. 4, one pixel value (Gb) of an output image is calculated from a 3×3 pixel region 211 of the pixel unit illustrated in FIG. 4(a), on the basis of four pixel signals of the same color (in this example, Gb). By executing the pixel value combination process, the pixel number reduction image 220 is generated and is output through the output unit 163.

The two pixels of the four pixels that become combination targets are the high sensitivity pixels and the other two pixels are selected from the low sensitivity pixels.

A specific process example in the pixel information combining unit 162 will be described with reference to FIG. 4.

Referring to FIG. 4, a pixel value calculation process example of a Gb pixel will be described.

When the pixel information combining unit 162 generates one pixel information from four pixel information, the pixel information combining unit 162 calculates a weighting average of a high sensitivity analog post-addition signal {Gb(1, 1)+Gb(1, 3)} and a low sensitivity analog post-addition signal {Gb(3, 1)+Gb(3, 3)}, as illustrated in FIG. 4.

Specifically, a pixel value Gb(out) of Gb of the pixel number reduction image is calculated according to the following expression (expression 1).

$$Gb(out) = \{Gb(1,1) + Gb(1,3)\} \times \alpha + \{Gb(3,1) + Gb(3,3)\} \times (Gain) \times \beta \quad \text{(expression 1)}$$

However, Gain represents a gain value to compensate for a sensitivity ratio of the high sensitivity pixel and the low sensitivity pixel and $\alpha$ and $\beta$ represent multiplication parameters functioning as weighting coefficients satisfying $\alpha + \beta = 1$.

As $\alpha$ and $\beta$, different values may be used for each color of R, Gb, Gr, and B. In addition, $\alpha$ and $\beta$ may be changed according to brightness of a subject.

Similar to the above expression (expression 1), for each of R, Gb, Gr, and B, an analog addition value of two pixels of the high sensitivity pixels and a sensitivity compensated value of an analog addition value of two pixels of the low sensitivity pixels are calculated by executing an addition process of multiplication results by the preset multiplication parameters $\alpha$ and $\beta$.

That is, a weighting average of the analog addition value of the two pixels of the high sensitivity pixels and the sensitivity compensated value of the analog addition value of the two pixels of the low sensitivity pixels is calculated and a calculation value is set as an output pixel value of the pixel number reduction image illustrated in FIG. 4(b), for example, a pixel value of Gb(out) 221 illustrated in FIG. 4.

Figure 5:
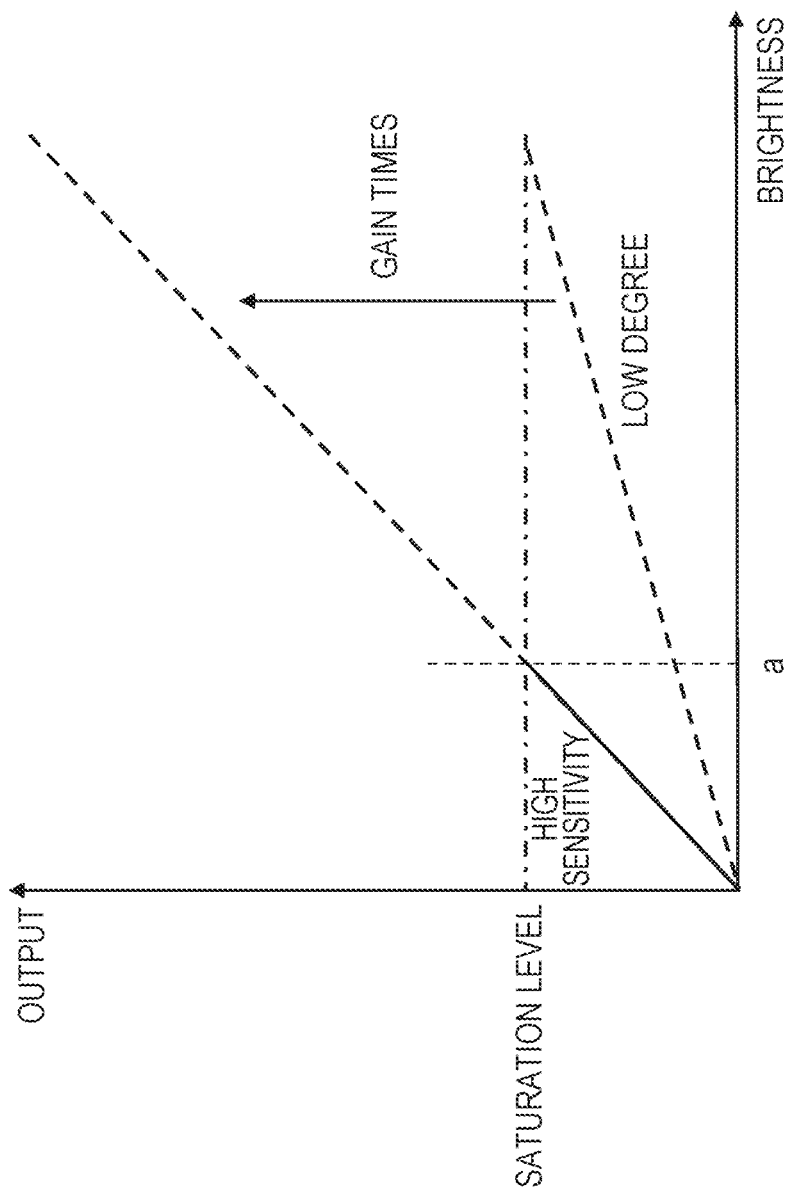
FIG. 5 is a diagram illustrating a correspondence relation of brightness and outputs of a high sensitivity pixel and a low sensitivity pixel and gain control functioning as an adjustment process of the output of the low sensitivity pixel.

Gain of the (expression 1) is a coefficient to compensate for a sensitivity difference as described above. For example, in the case in which the sensitivity ratio of the low sensitivity pixel and the high sensitivity pixel is 1:4, as illustrated in FIG. 5, when subject brightness is the same, a pixel value (output) of the low sensitivity pixel becomes ¼ of a pixel value of the high sensitivity pixel. To calculate an estimation pixel value when the low sensitivity pixel is converted into the high sensitivity pixel, gain of four times is given to an output from the low sensitivity pixel.

As illustrated in FIG. 5, if the brightness of the subject increases and becomes brightness more than brightness of a point a, the high sensitivity pixel may be saturated and a pixel value of the entire subject of brightness equal to or more than the brightness of the point a may be output as a saturation pixel value.

Meanwhile, in the low sensitivity pixel, a pixel value of the subject of brightness equal to or more than the brightness of the point a is not saturated and a pixel value output according to the brightness of the subject can be generated.

For example, in a pixel region where the subject is dark, when a pixel value of a high sensitivity pixel having small noise is selected and output or the pixel value of the high sensitivity pixel and a pixel value of a low sensitivity pixel are combined, a pixel value calculated by a combination process in which a weight of the high sensitivity pixel is increased is output.

In addition, in the case in which the subject is bright, when a pixel value of a low sensitivity pixel not to be saturated is selected and output or the pixel value of the high sensitivity pixel and the pixel value of the low sensitivity pixel are combined, a pixel value calculated by a combination process in which a weight of the low sensitivity pixel is increased is output.

By executing this process, a pixel value in which linearity for brightness is maintained can be output and a wide dynamic range image in which the brightness from the dark subject to the bright subject is expressed exactly can be output.

The pixel information combining unit 162 in the operation unit 160 of the imaging device 192 illustrated in FIG. 3 executes the above process using the pixel values of the two high sensitivity pixels and the two low sensitivity pixels included in the 3×3 pixel region 211 illustrated in FIG. 4 and outputs a wide dynamic range image.

Specifically, in the (expression 1) described above, that is, Gb(out)={Gb(1, 1)+Gb(1, 3)}×α+{Gb(3, 1)+Gb(3, 3)}× (Gain)×β . . . (expression 1), the multiplication parameters α and β to be the weighting coefficients for an addition value of the high sensitivity pixels: {Gb(1, 1)+Gb(1, 3)} and an addition value of the low sensitivity pixels: {Gb(3, 1)+Gb(3, 3)} are changed according to the subject brightness as described with reference to FIG. 5 and an output pixel value (Gout) is calculated.

In setting illustrated in FIG. 4, a determination of the brightness may be executed in units of 3×3 pixel regions and the multiplication parameters α and β to be the weighting coefficients in the units thereof may be set in the units of the 3×3 pixel regions.

Next, a detailed configuration example of the pixel unit 151 of the imaging device 102 illustrated in FIG. 3 will be described with reference to FIG. 6.

Figure 6:
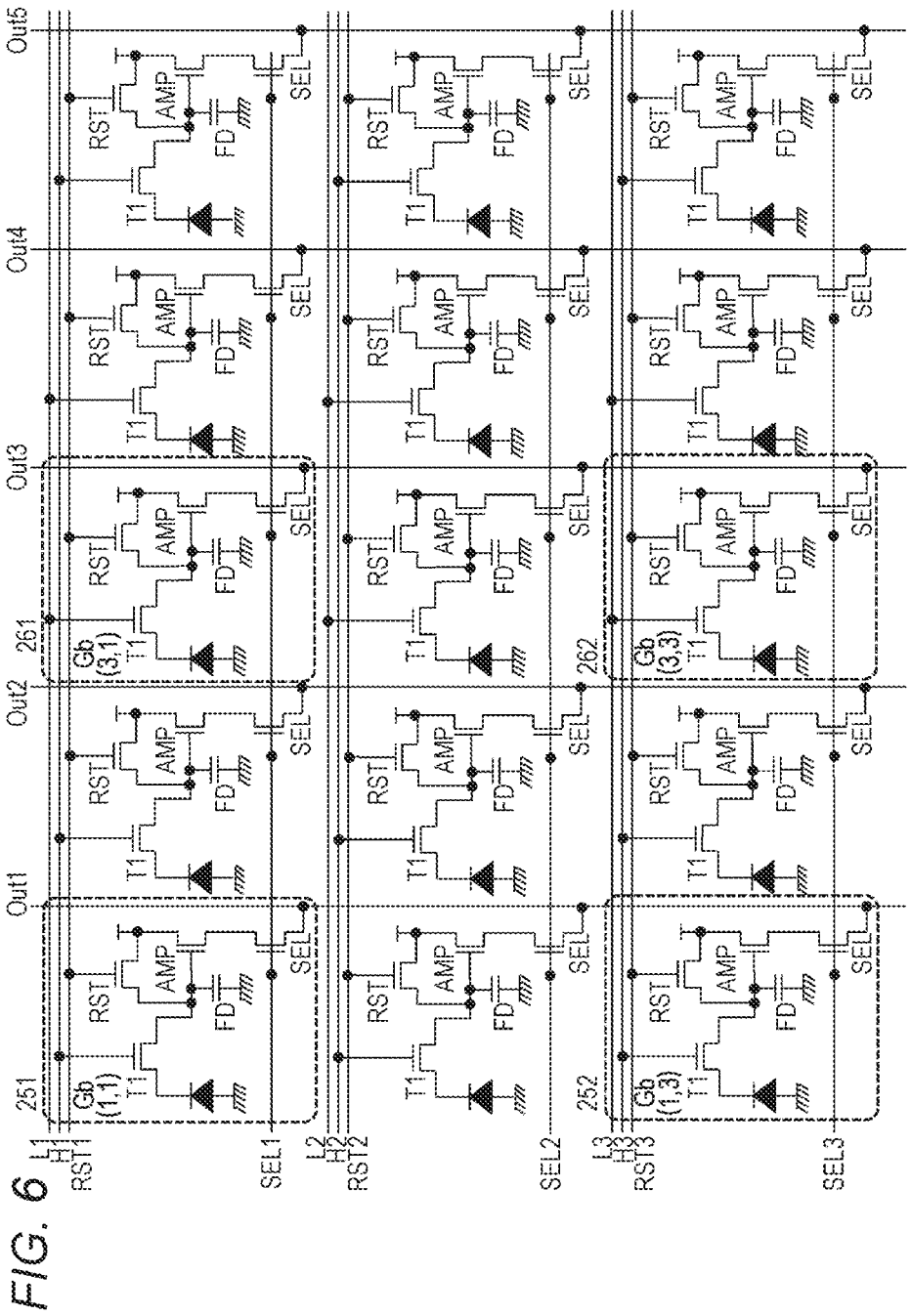
FIG. 6 is a diagram illustrating a circuit configuration of a pixel unit of an imaging device in an image processing apparatus according to a first embodiment.

FIG. 6 illustrates the detail of the pixel unit 151. The pixel unit 151 is configured by, for example, a MOS-type image sensor (CMOS sensor).

In FIG. 6, only 5×3=15 pixels of the pixel unit 151 are illustrated.

5 pixels are arranged in an x direction and 3 pixels are arranged in a y direction.

A Gb(1, 1) pixel 251 of an upper left end illustrated in the drawing corresponds to a pixel Gb(1, 1) of an upper left end illustrated in FIG. 4(a).

Four Gb pixels that are shown by a dotted frame illustrated in FIG. 6, that is, Gb(1, 1) 251, Gb(1, 3) 252, Gb(3, 1) 253, and Gb(3, 3) 254 correspond to four Gb pixels included in a 3×3 pixel region 211 of an upper left end illustrated in FIG. 4(a).

As described above with reference to FIG. 4, an exposure time of the pixel unit 151 is controlled in units of pixels, by control of the control unit 105, and two kinds of pixels, that is, high sensitivity pixels to which a long exposure time is set and low sensitivity pixels to which a short exposure time is set are alternately set in units of two columns, according to a line of the vertical direction.

The two pixels of the Gb(1, 1) 251 and the Gb(1, 3) 252 are high sensitivity pixels in which long time exposure is performed.

The two pixels of the Gb(3, 1) 253 and the Gb(3, 3) 254 are low sensitivity pixels in which short time exposure is performed.

To realize this exposure control configuration, as signal lines connected to a control transistor T1 of each pixel, two signal lines L1 and H1 are provided for each row.

Each of the signal lines L1 and H1 is a signal line to transmit a control signal of an exposure start time of each pixel to each pixel.

Figure 7:
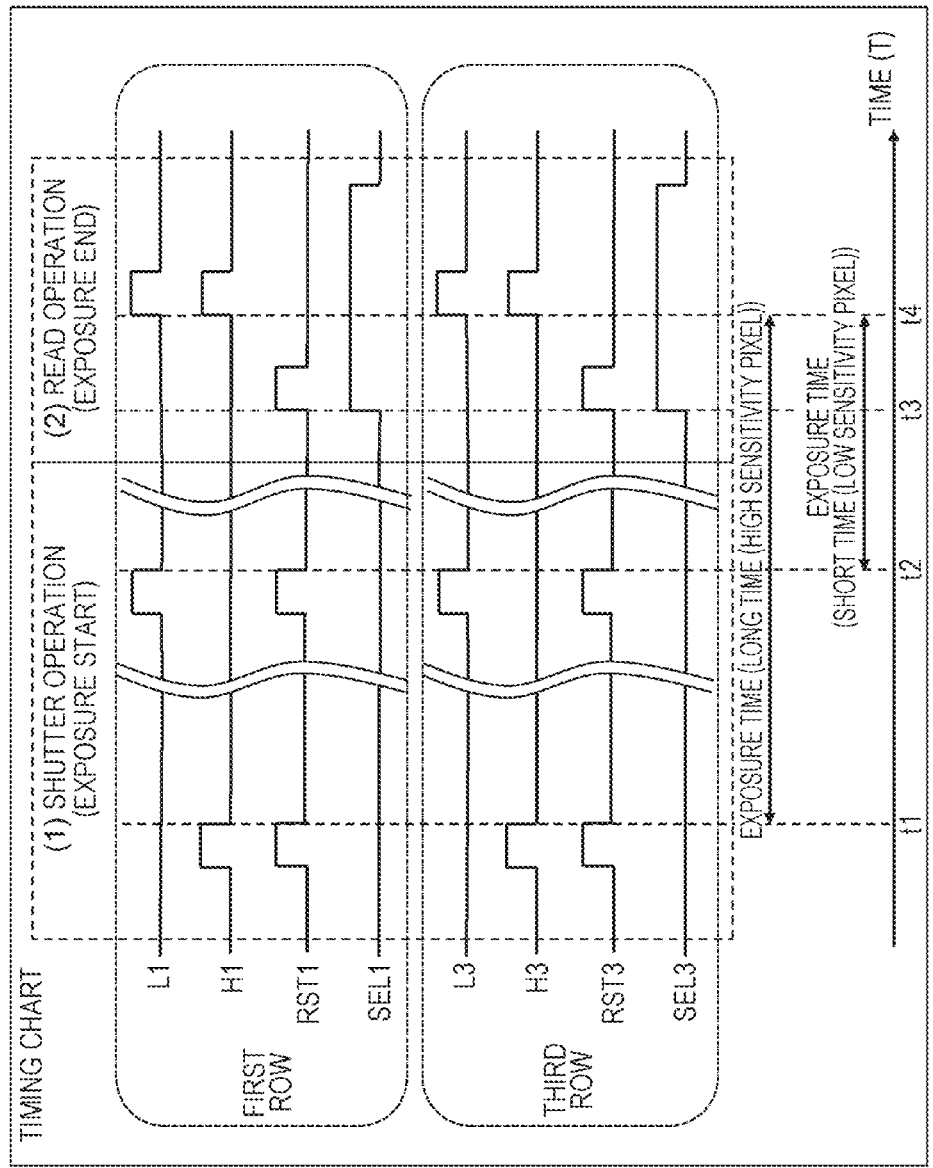
FIG. 7 is a diagram illustrating a timing chart describing an imaging sequence in the image processing apparatus according to the first embodiment.

FIG. 7 is a timing chart illustrating transmission timing of a control signal for the pixel unit illustrated in FIG. 6 and an exposure time control process of each pixel.

A normal CMOS sensor performs operations that are broadly divided into a shutter operation and a read operation. The shutter operation is an operation when imaging (exposure) is started. In the shutter operation, as a physical state of a photodiode, a process for setting electrons to vacant by a reset process (RST signal ON and L1 or H1 signal ON) and starting accumulation of electrons according to a light reception amount at the same time (then, RST signal OFF and L1 or H1 signal OFF) is executed. The exposure is started by the shutter operation.

The exposure end is executed after timing is determined by the read operation.

During the read operation, a selection signal (SEL) to be a selection signal of a pixel of which a pixel value is read is set to ON, (RST) for a reset process of floating diffusion (FD) at this timing is set to ON, an FD accumulation charge based on noise before the exposure start is removed, the signal lines (L1 and H1) to operate a control transistor (T1) of each pixel are set to ON during an ON period of the selection signal (SEL), and a pixel value of a pixel in which both the selection signal (SEL) and signals of the signal lines (L1 and H1) become ON is read.

As described above, the pixel unit 151 of the imaging device 102 according to the present disclosure has a configuration in which the high sensitivity pixels and the low sensitivity pixels are alternately set in units of two columns in a strip shape in the vertical direction, as described with reference to FIG. 4.

This is realized at the timing chart illustrated in FIG. 7.

A read process of a pixel value from the pixel unit 151 is executed according to the following sequence.

(S1) A first row and a third row are read at the same time and two pixel values of the same column are added and output, (S2) A second row and a fourth row are read at the same time and two pixel values of the same column are added and output, (S3) A fifth row and a seventh row are read at the same time and two pixel values of the same column are added and output, (S4) A sixth row and an eighth row are read at the same time and two pixel values of the same column are added and output, . . . .

Hereinafter, pixel values of pixels of the same color of the same column of two rows with one row therebetween are read at the same time and the pixel values are added and output.

In this example, the high sensitivity pixels and the low sensitivity pixels are set in units of two columns. In each of steps (S1), (S2), (S3), . . . , pixel value addition of the two high sensitivity pixels and pixel value addition of the two low sensitivity pixels are executed and a high sensitivity pixel addition value and a low sensitivity pixel addition value are output.

The timing chart illustrated in FIG. 7 illustrates an execution example of the shutter operation and the read operation as the process sequence of the first row and the third row.

First, at a time (t1), a reset signal (RST1) of the first row, a reset signal (RST3) of the third row, a control signal (H1) functioning as an exposure start signal for only a high sensitivity pixel column of the first row and used to operate a control transistor T1 of the high sensitivity pixel, and a control signal (H3) functioning as an exposure start signal for only a high sensitivity pixel column of the third row and used to operate the control transistor T1 of the high sensitivity pixel are set to High (ON).

By this process, the control transistors (T1) of the high sensitivity pixels of the first row and the third row connected to the signal lines H1 and H3 become ON, electrons in the photodiodes set to the high sensitivity pixel columns of the first row and the third row become vacant, and new charge accumulation according to subject light starts (high sensitivity pixel shutter operation).

Next, at a time (t2), the reset signal (RST1) of the first row, the reset signal (RST3) of the third row, a control signal (L1)

functioning as an exposure start signal for only a low sensitivity pixel column of the first row and used to operate the control transistor T1 of the low sensitivity pixel, and a control signal (L3) functioning as an exposure start signal for only a low sensitivity pixel column of the third row and used to operate the control transistor T1 of the low sensitivity pixel are set to High (ON).

By this process, the control transistors (T1) of the low sensitivity pixels of the first row and the third row connected to the signal lines L1 and L3 become ON, electrons in the photodiodes set to the low sensitivity pixel columns of the first row and the third row become vacant, and new charge accumulation according to subject light starts (low sensitivity pixel shutter operation).

Next, the read operation is executed.

First, at a time (t3), for the first row and the third row to be addition target rows by simultaneous read, the reset signals (RST1 and RST3) of the first row and the third row and the selection signals (SEL1 and SEL3) of the first row and the third row are set to High (ON) at the same time and resetting (RST) of the floating diffusion (FD) is performed.

By this process, the charge due to noise accumulated in the FD is removed.

Next, at a time (t4) in a period during which the selection signals (SEL1 and SEL3) of the first row and the third row are set to High (On), all of the control signal (H1) functioning as the exposure start signal for only the high sensitivity pixel column of the first row and used to operate the control transistor T1 of the high sensitivity pixel, the control signal (H3) functioning as the exposure start signal for only the high sensitivity pixel column of the third row and used to operate the control transistor T1 of the high sensitivity pixel are set to High (ON), the control signal (L1) functioning as the exposure start signal for only the low sensitivity pixel column of the first row and used to operate the control transistor T1 of the low sensitivity pixel, and the control signal (L3) functioning as the exposure start signal for only the low sensitivity pixel column of the third row and used to operate the control transistor T1 of the low sensitivity pixel are set to High (ON).

For the pixel values of the first row and the third row, pixel values of the same column are added and are output through one output line.

That is, an addition pixel value of two high sensitivity pixels of a Gb pixel 251 [Gb(1, 1)] of the first row and the first column and a Gb pixel 252 [Gb(1, 3)] of the third row and the first column is output from the first column to be the high sensitivity pixel column illustrated in FIG. 6, through an output line (Out1).

In addition, an addition pixel value of two low sensitivity pixels of a Gb pixel 261 [Gb(3, 1)] of the first row and the third column and a Gb pixel 262 [Gb(3, 3)] of the third row and the third column is output from the third column to be the low sensitivity pixel column illustrated in FIG. 6, through an output line (Out3).

An output configuration of an addition result of the pixels will be described with reference to FIG. 8.

Figure 8:
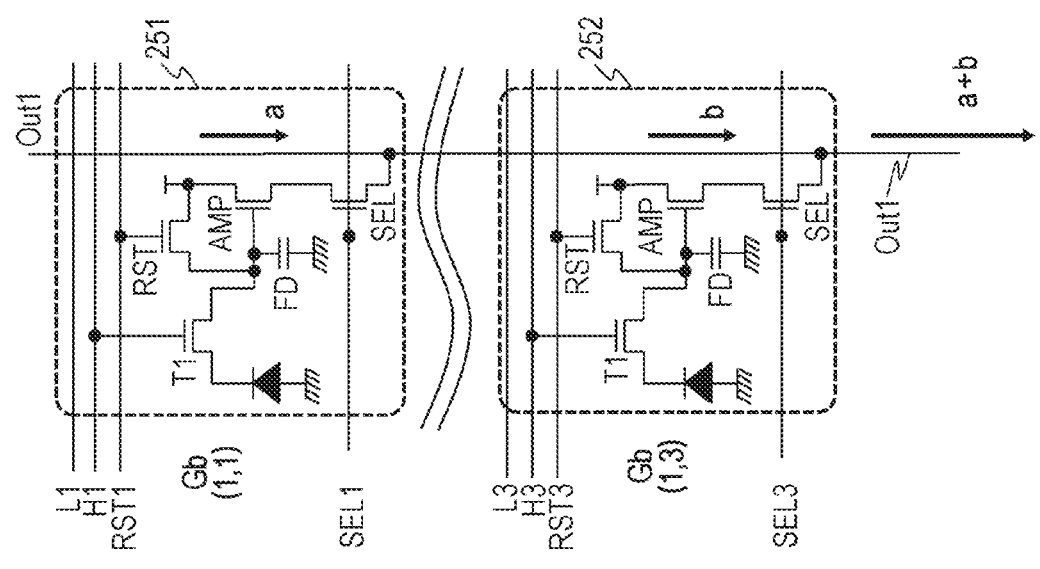
FIG. 8 is a diagram illustrating a pixel value addition/output process of a plurality of pixels.

FIG. 8 illustrates the two pixels of the first column to be the high sensitivity pixel column illustrated in FIG. 6, that is, the Gb pixel 251 [Gb(1, 1)] of the first row and the first column and the Gb pixel 252 [Gb(1, 3)] of the third row and the first column.

By signal setting of the time (t4) illustrated in FIG. 7, two pixels of the vertical direction enter an active state as illustrated in FIG. 8. As a result, currents of AMP transistors are added, so that pixel addition at analog levels is executed.

Specifically, the following processes are executed.

A pixel value a is output from the Gb pixel 251 [Gb(1, 1)] of the first row and the first column to the output line (Out1).

A pixel value b is output from the Gb pixel 252 [Gb(1, 3)] of the third row and the first column to the output line (Out1).

As a result, an addition value a+b of the two pixels is output from the output line (Out1).

A pixel addition/output process example illustrated in FIG. 8 is an addition/output process example of the high sensitivity pixels of the first column. However, in the third column, pixel value addition of the low sensitivity pixels is executed and a pixel value addition result of the two low sensitivity pixels is output from the output line (Out3).

In addition, pixel values of the same color of the same column of two rows with one row therebetween in combinations of the rows in which outputs of all other same timings are executed, that is, combinations of the first row and the third row, the second row and the fourth row, the fifth row and the seventh row, the sixth row and the eighth row, ... are added and are output.

As such, an addition signal of the pixel values of the two pixels is output from the pixel unit 151 illustrated in FIG. 3.

The high sensitivity pixel information 181 illustrated in FIG. 3 is an addition signal of a plurality of high sensitivity pixels and the low sensitivity pixel information 182 is also an addition signal of a plurality of low sensitivity pixels.

A point at the timing chart illustrated in FIG. 7 is that a shutter time, that is, the exposure start time can be set to a different time in the same row.

The exposure time can be made to be different by delaying the shutter time in the high sensitivity pixel column and the low sensitivity pixel column and the sensitivity can be changed in the same row.

In addition, because the sensitivity becomes the same in the vertical direction, the addition of the analog levels described above is enabled. The addition of the analog levels can contribute to improving a frame rate of a CMOS sensor. Here, an example of the addition of the two pixels has been described. However, addition of three pixels or more is also enabled.

Figure 9:
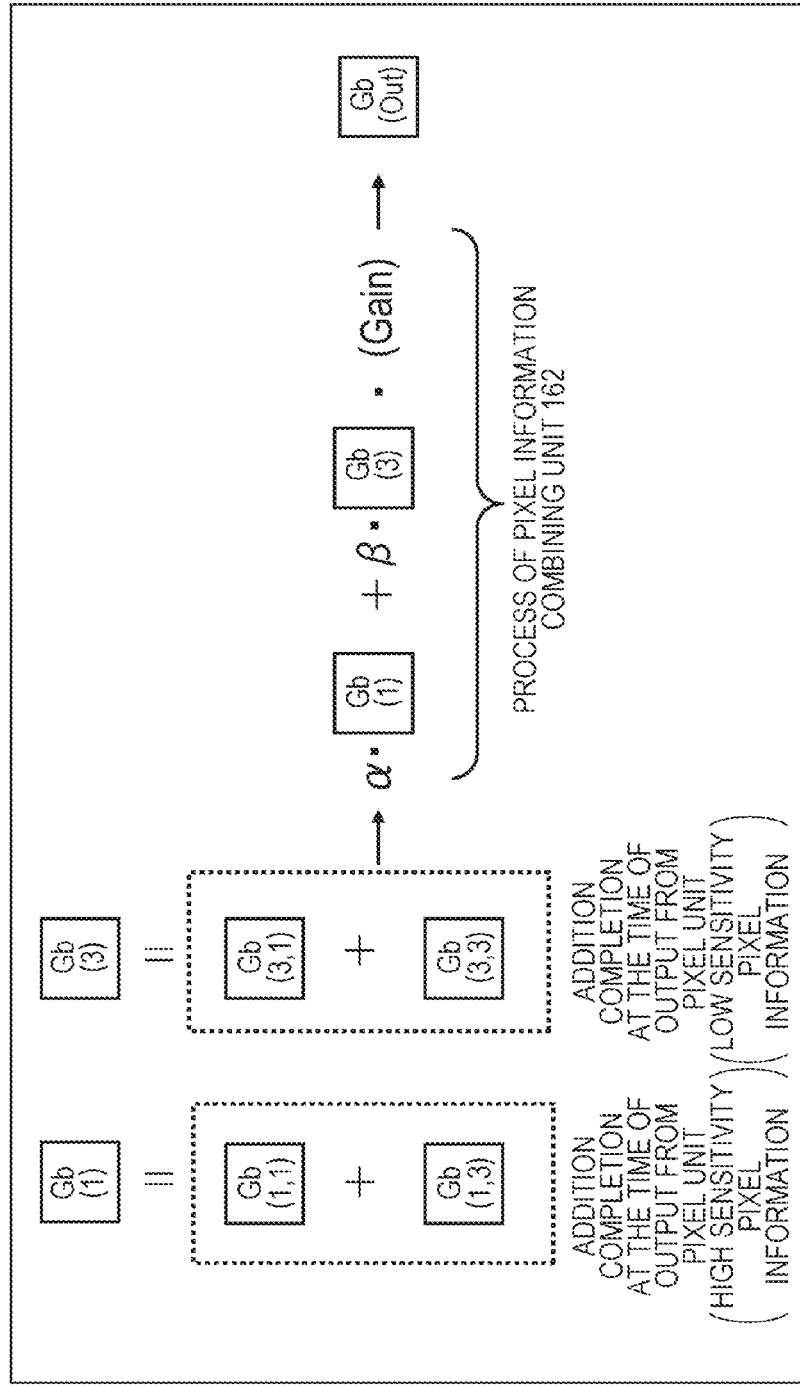
FIG. 9 is a diagram illustrating an example of a determination algorithm of an output pixel in a pixel information combining unit of the imaging device in the image processing apparatus.

FIG. 9 is a diagram illustrating an example of a process for generating one pixel information from four pixels.

A high sensitivity analog post-addition signal {Gb(1, 1)+Gb(1, 3)} and a low sensitivity analog post-addition signal {Gb(3, 1)+Gb(3, 3)} are output from the pixel unit 151 illustrated in FIG. 3.

These signals are the high sensitivity pixel information 181 and the low sensitivity pixel information 182 illustrated in FIG. 3.

In an example illustrated in FIG. 9, these signals become high sensitivity pixel information: Gb(1)=Gb(1, 1)+Gb(1, 3) and low sensitivity pixel information: Gb(3)=Gb(3, 1)+Gb(3, 3).

The AD converter 161 of the operation unit 160 illustrated in FIG. 3 converts a value of an addition signal: Gb(1) and Gb(3) into a digital value and inputs the digital value to the pixel information combining unit 162.

The pixel information combining unit 162 generates one output pixel value: Gb(out) from addition pixel information: Gb(1) and Gb(3).

As illustrated in FIG. 9, the pixel information combining unit 162 calculates an output pixel value: Gb(out) according to the following expression 2:

$$Gb(\text{Out}) = \alpha \times Gb(1) + \beta \times Gb(3) \times (\text{Gain}) \quad \text{expression 2)}$$

and outputs the output pixel value through the output unit 163.

However, Gain represents a gain value to compensate for a sensitivity ratio of the high sensitivity pixel and the low sensitivity pixel and α and β represent multiplication parameters functioning as weighting coefficients satisfying α+β=1.

The (expression 2) is the same expression as the (expression 1) described above, that is, Gb(out)={Gb(1, 1)+Gb(1, 3)}×α+{Gb(3, 1)+Gb(3, 3)}×(Gain)×13 . . . (expression 1).

As such, in the imaging apparatus according to the present disclosure, the analog addition is performed in the vertical direction by the pixel unit 151. Then, in the pixel information combining unit 162 of the operation unit 160, digital addition is performed in the horizontal direction.

Figure 10:
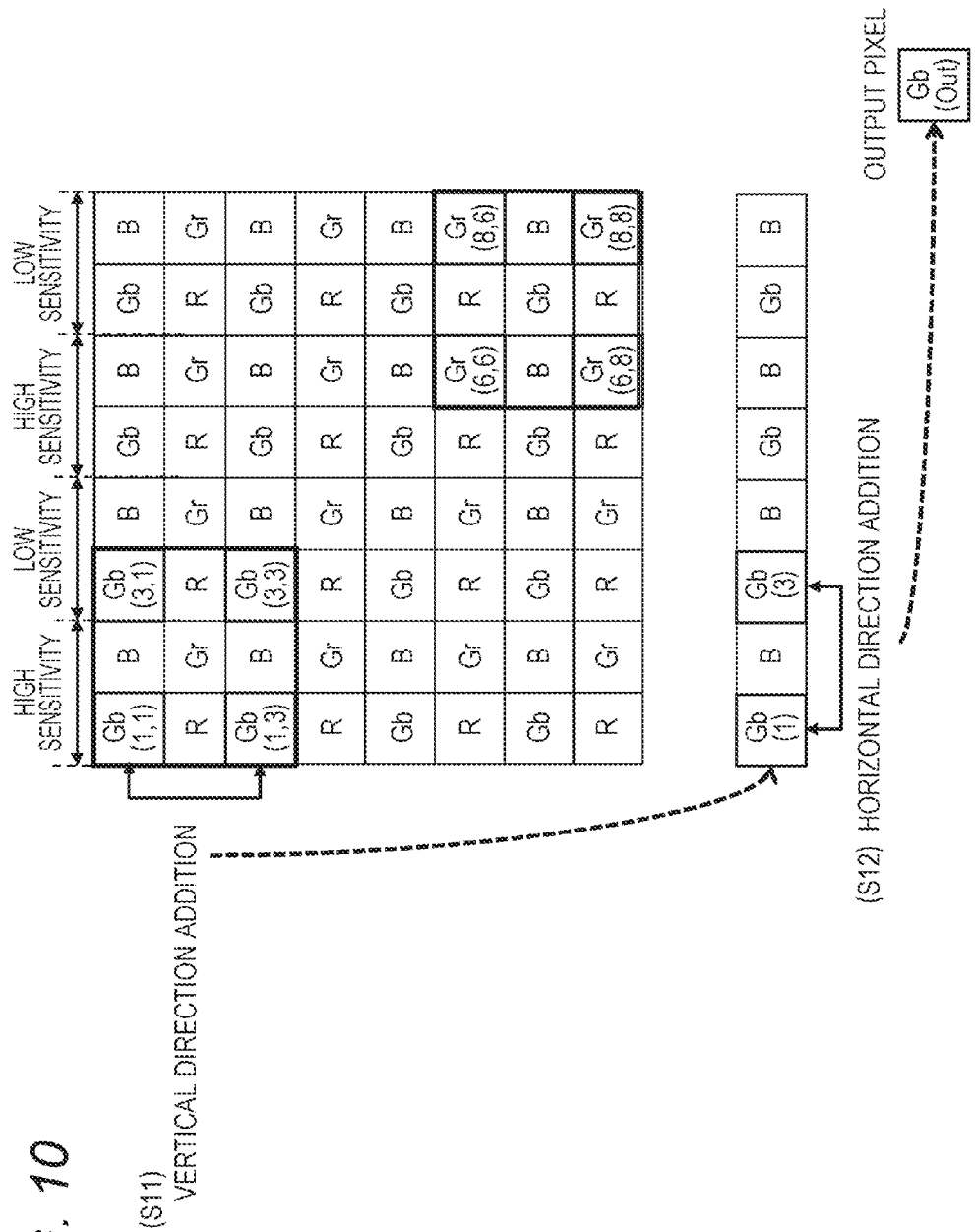
FIG. 10 is a diagram illustrating an example of a determination algorithm of an output pixel in the pixel information combining unit of the imaging device in the image processing apparatus.

Similar to FIG. 9, FIG. 10 is a diagram illustrating an example of a process for generating one pixel information of an output image from four pixels of the pixel unit.

FIG. 10 illustrates the case in which pixel value calculation of an output image is executed by (S11) a process for adding analog values of two pixels of the same sensitivity, which is executed in the pixel unit, and (S12) a process for adding an addition result [G (1)] of the high sensitivity pixels and an addition result [G (3)] of the low sensitivity pixels by performing multiplication of weighting coefficients and gain adjustment and calculating a pixel value [G (Out)] of an output pixel, which is executed in the pixel information combining unit.

Figure 11:
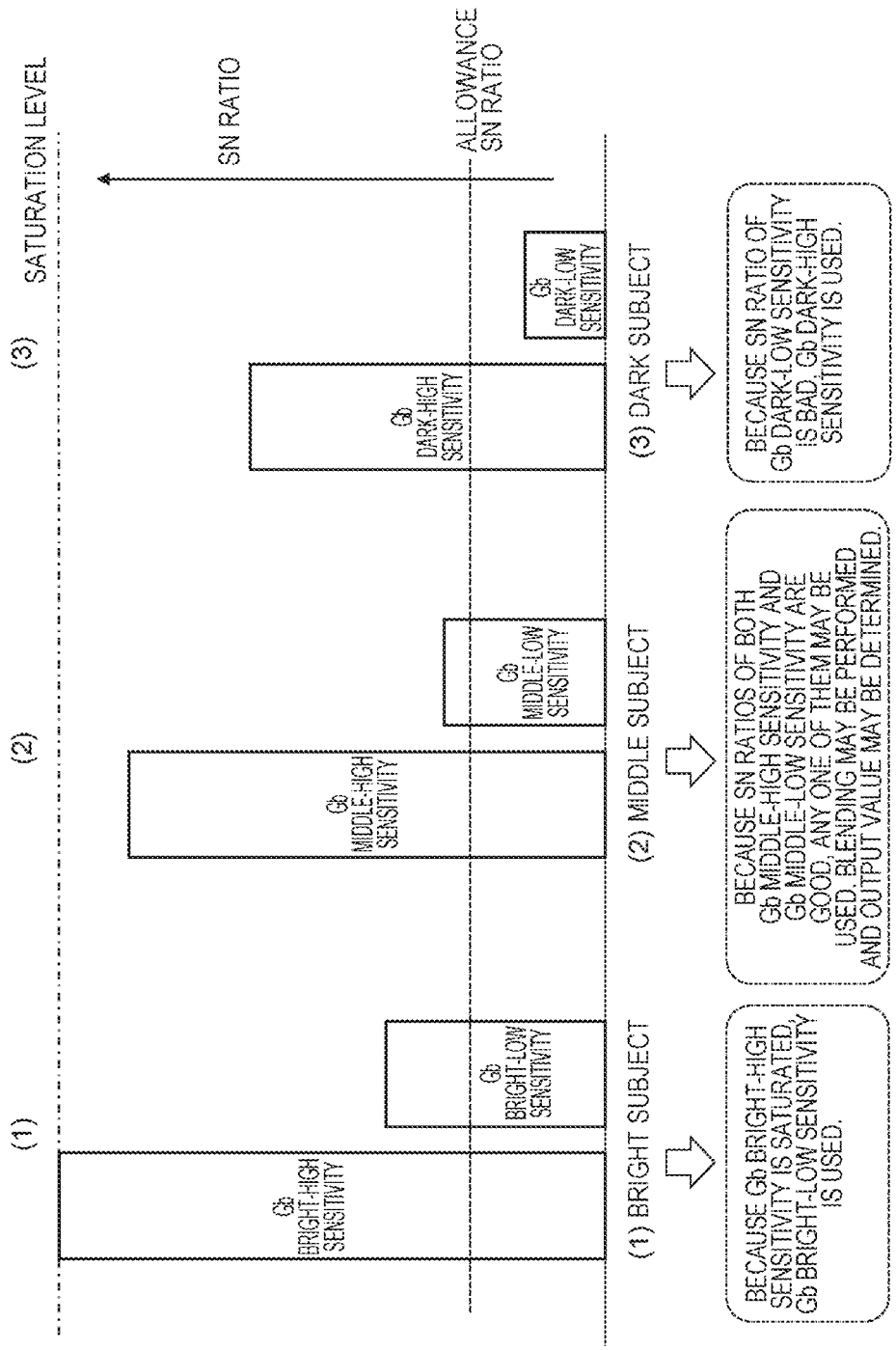
FIG. 11 is a diagram illustrating an example of a determination algorithm of an output pixel in the pixel information combining unit of the imaging device in the image processing apparatus.

FIG. 11 is a diagram illustrating an example of a generation process of the combination image generated by the image information combining unit 162 of the operation unit 160 illustrated in FIG. 3, that is, a pixel information combination image.

As described above, the pixel information combining unit 162 of the operation unit 160 illustrated in FIG. 3 applies pixel values of a plurality of pixels and determines a pixel value of one pixel of an output image.

The pixel information combining unit 162 calculates one pixel value from a plurality of pixel values of an imaging image, according to the (expression 1) to be a pixel value calculation expression of a combination image, that is, Gb(out)={Gb(1, 1)+Gb(1, 3)}×α+{Gb(3, 1)+Gb(3, 3)}×(Gain)×β . . . (expression 1).

As described above, the coefficients: α and β of the above expression may be set to be changed according to brightness of a subject. For example, for a bright subject, a pixel value of the high sensitivity pixel becomes a saturation state, that is, a maximum pixel value and an exact pixel value may not be applied. In this case, a process for not applying pixel values of Gb(1, 1) and Gb(1, 3) of the high sensitivity pixels as α=0, applying only pixel values of Gb(3, 1) and Gb(3, 3) of the low sensitivity pixels as β=1, and calculating an output pixel value is executed.

FIG. 11 illustrates three process aspects for this process aspect. That is, FIG. 11 is a diagram illustrating aspects of combination processes corresponding to imaging regions of (1) a bright subject (a pixel value of the high sensitivity pixel is a saturation value), (2) a subject of middle brightness (a pixel value of the high sensitivity pixel is equal to or less than the saturation value and SN ratios of the high sensitivity pixel and the low sensitivity pixel are equal to or more than a predetermined allowance SN ratio), and (3) a dark subject (a pixel value of the high sensitivity pixel is equal to or less than the saturation value and an SN ratio of the low sensitivity pixel is less than the predetermined allowance SN ratio).

Each of the process aspects will be described.
(1) Bright subject (the pixel value of the high sensitivity pixel is the saturation value)

As illustrated in FIG. 11(1), when the subject is bright and the pixel value of the high sensitivity pixel is the saturation value, the pixel value of the high sensitivity pixel becomes a maximum pixel value corresponding to an accumulatable maximum charge amount in each pixel of the pixel unit and an exact pixel value cannot be applied.

In this case, the pixel value of the high sensitivity pixel is not applied to calculation of a pixel value of an output pixel of a pixel information combination image. In an example illustrated in FIG. 11(1), the setting of the coefficients: a and 13 in the (expression 1) described above becomes the following setting.

That is, the process for not applying the pixel value of the high sensitivity pixel and applying only the pixel value of the low sensitivity pixel as α=0 and β=1 and calculating the output pixel value is executed.

(2) Subject of middle bright (the pixel value of the high sensitivity pixel is equal to or less than the saturation value and the SN ratios of the high sensitivity pixel and the low sensitivity pixel are equal to or more than the predetermined allowance SN ratio)

As illustrated in FIG. 11(2), when the brightness of the subject is middle, that is, the pixel value of the high sensitivity pixel is equal to or less than the saturation value and the SN ratios of the high sensitivity pixel and the low sensitivity pixel are equal to or more than the predetermined allowance SN ratio, the following processes are executed.

Because it can be determined that exact pixel values of both the high sensitivity pixel and the low sensitivity pixel are applied, any one of the high sensitivity pixel and the low sensitivity pixel may be selected and used and the pixel value thereof may be set as a pixel value of a pixel information combination image. The pixel value of the pixel information combination image may be calculated by executing a blend process using both the high sensitivity pixel and the low sensitivity pixel.

In this case, as the setting of the coefficients α and β in the (expression 1) described above, various setting can be made in a range in which the condition α+β=1 is satisfied. For example, as setting like α=β=0.5, an average of a total of four pixels of two pixels of the high sensitivity pixels and two pixels of the low sensitivity pixels may be set as a pixel value of one output pixel in a pixel information combination image.
(3) Dark subject (the pixel value of the high sensitivity pixel is equal to or less than the saturation value and the SN ratio of the low sensitivity pixel is less than the predetermined allowance SN ratio)

As illustrated in FIG. 11(3), when the subject is dark, that is, the pixel value of the high sensitivity pixel is equal to or less than the saturation value and the SN ratio of the low sensitivity pixel is less than the predetermined allowance SN ratio, the following processes are executed.

The pixel value of the low sensitivity pixel is less than the predetermined allowance SN ratio and it cannot be said that an exact pixel value is applied. In this case, an output pixel value of a pixel information combination image is calculated on the basis of only the pixel value of the high sensitivity pixel without applying the pixel value of the low sensitivity pixel.

In this case, as the setting of the coefficients: α and β in the (expression 1) described above, α=0 and β=1 are set.

That is, an output pixel value of a pixel information combination image is calculated by applying only the pixel value of the high sensitivity pixel without using the pixel value of the low sensitivity pixel.

A setting example of a weighting coefficient corresponding to a contribution degree of an input pixel for an output pixel will be described with reference to FIG. 12.

Figure 12:
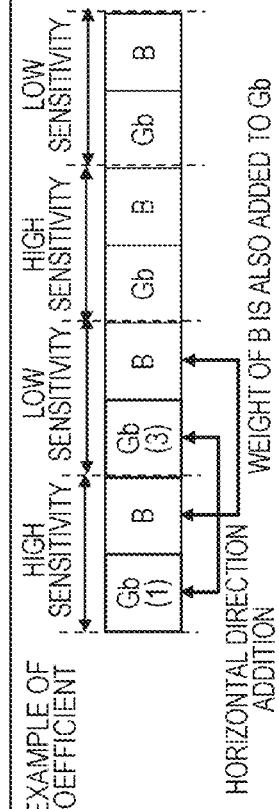
FIG. 12 is a diagram illustrating an example of a determination algorithm of an output pixel in the pixel information combining unit of the imaging device in the image processing apparatus.

FIG. 12(1) illustrates a setting example of a weighting coefficient: $W_H$ (=α) to be a multiplication parameter for high sensitivity pixel information and a weighting coefficient: $W_L$ (=β) to be a multiplication parameter for low sensitivity pixel information.

As illustrated in FIG. 12(1), if an output pixel value is described using a Gb pixel as an example, the output pixel value becomes Gb(Out)=(high sensitivity pixel information (Gb(1)))×$W_H$+(low sensitivity pixel information (Gb(3)))×(gain)×$W_L$.

The high sensitivity pixel information (Gb(1)) is a pixel value addition result of two high sensitivity pixels of the same column.

The low sensitivity pixel information (Gb(3)) is a pixel value addition result of two low sensitivity pixels of the same column.

$W_H$: a weighting coefficient (=α) corresponding to a high sensitivity pixel of an input pixel $W_L$: a weighting coefficient (=β) corresponding to a low sensitivity pixel of an input pixel However, $W_H$ and $W_L$ are coefficients that satisfy a relation of $W_H+W_L=1$.

FIG. 12(1) illustrates a setting example of the weighting coefficient $W_H$ corresponding to the high sensitivity pixel of the input pixel and the weighting coefficient $W_L$ corresponding to the low sensitivity pixel of the input pixel.

Here, using a different coefficient according to the pixel value of the low sensitivity pixel is set.

Specifically, the following setting coefficients illustrated in FIG. 12(1) are used.

Furthermore, it is assumed that a pixel value of each pixel is an output of 10 bits (0 to 1023).

The following setting is made according to a pixel value (data) of the low sensitivity pixel.

(a) the case of 0≤data<50: $W_H$=1.0 and $W_L$=0
(b) the case of 50≤data<100: $W_H$=0.5 and $W_L$=0.5
(c) the case of 100≤data<1023: $W_H$=0 and $W_L$=1.0

The coefficient setting is performed on the basis of the following assumptions.

(a) The Case of 0≤data<50

As such, when a pixel value (data) of the low sensitivity pixel is small, it is estimated that brightness of a subject is low and an SN ratio of the pixel value of the low sensitivity pixel is low. In this case, it is determined that the reliability of the pixel value (data) of the low sensitivity pixel is low and it is estimated that a pixel value of a neighboring high sensitivity pixel is not saturated. In this case, a multiplication coefficient: $W_L$ for the pixel value of the low sensitivity pixel is set as 0, a multiplication coefficient: $W_H$ for the pixel value of the high sensitivity pixel is set as 1, and a pixel value [Gb(out)] of a combination pixel depending on only the pixel value of the high sensitivity pixel is calculated.

(b) The Case of 50≤data<100

As such, when a pixel value (data) of the low sensitivity pixel is middle, it is estimated that brightness of a subject is middle and an SN ratio of the pixel value of the low sensitivity pixel is good. In this case, it is determined that the reliability of the pixel value (data) of the low sensitivity pixel is high and it is estimated that a pixel value of a neighboring high sensitivity pixel is not saturated. In this case, the pixel value of the low sensitivity pixel and the pixel value of the high sensitivity pixel are blended. That is, a multiplication coefficient: $W_L$ for the pixel value of the low sensitivity pixel is set as 0.5, a multiplication coefficient: $W_H$ for the pixel value of the high sensitivity pixel is also set as 0.5, and a pixel value [Gb(out)] of a combination pixel is calculated by an average of two pixel values of the high sensitivity pixel and the low sensitivity pixel.

(c) The Case of 100≤data<1023

As such, when a pixel value (data) of the low sensitivity pixel is high, it is determined that brightness of a subject is very high. In this case, it is determined that an SN ratio of the pixel value of the low sensitivity pixel is good and the reliability of the pixel value (data) of the low sensitivity pixel is high. However, it is estimated that a pixel value of a neighboring high-sensitive pixel is more likely to be saturated. In this case, a multiplication coefficient: $W_H$ for the pixel value of the high sensitivity pixel is set as 0, a multiplication coefficient: $W_L$ for the pixel value of the low sensitivity pixel is set as 1, and a pixel value [Gb(out)] of a combination pixel depending on only the pixel value of the low sensitivity pixel is calculated.

As such, setting of the coefficients can be performed using the low sensitivity pixel information. Here, the three kinds are described for simplification of description. However, a function for calculating the weight on the basis of the low sensitivity pixel information may be set in advance and the pixel information combining unit 162 illustrated in FIG. 3 may execute an operation to which the predetermined function is applied may be executed on the basis of the low sensitivity pixel information 182 input from the pixel unit 151 and calculate the coefficients $W_H$ and $W_L$.

FIG. 12(2) illustrates a process example using a weighting coefficient applied to calculation of an output pixel value of a certain pixel as a weighting coefficient applied to calculation of an output pixel value of a neighboring pixel. In general, brightness of a pixel may be moderately changed in a pixel region of a certain range. By using this property, setting for using a weighting coefficient applied to calculation of an output pixel value of a Gb pixel in the case of calculating a B pixel adjacent to the Gb pixel or calculating an R pixel may be performed.

To stabilize the weighting coefficient without changing the weighting coefficient according to a color becomes to equally set which of the high sensitivity pixel information and the low sensitivity pixel information is mainly used, regardless of the predetermined region. This leads to stabilizing an exposure time of a region unit of an output image, thereby preventing generation of a false color due to a difference of the exposure period, such as when an object in an imaging state moves.

As described with reference to FIG. 8, addition of pixels more than two pixels is enabled. However, in this case, with respect to the horizontal direction, pixel values of pixels may be combined two pixels by two pixels and then a digital re-sampling process may be executed with respect to the horizontal direction to make an aspect ratio constant.

[3. With Respect to Other Embodiments]

(3.1. Second Embodiment)

In the embodiment described above, as the circuit configuration of each pixel, all of the pixels have the same circuit configuration, as described with reference to FIG. 6. Specifically, the circuit configuration is a circuit configuration in which each transistor of a control transistor (T1), an amplifying transistor (AMP), a reset transistor (RST), and a selection transistor (SEL) is set in each pixel unit.

However, for each transistor, a configuration in which partial transistors are used commonly to a plurality of pixels as one setting is enabled.

An example will be described with reference to FIG. 13.

Figure 13:
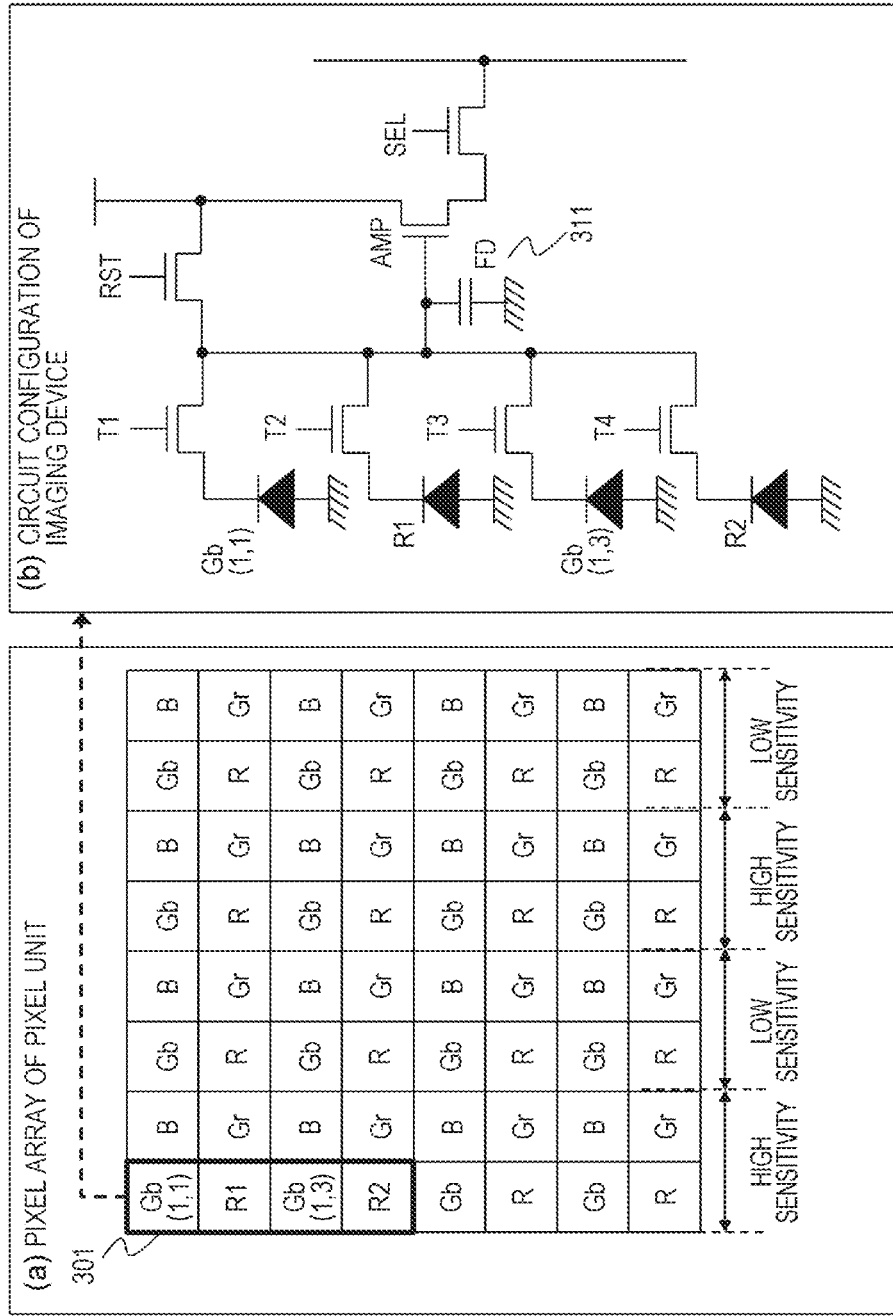
FIG. 13 is a diagram illustrating a circuit configuration of a pixel unit of an imaging device in an image processing apparatus according to a second embodiment.

A pixel unit configuration illustrated in FIG. 13 is a configuration in which the AMP transistor, the RST transistor, and the SEL transistor are shared by the pixels in which these transistors are arranged in four columns as one setting. FIG. 13 is a diagram illustrating an example of a pixel array based on a sharing pixel structure.

A circuit configuration of four pixel blocks 301 that are adjacent to columns of the pixel unit illustrated in FIG. 13(a) is a circuit illustrated in FIG. 13(b).

The AMP transistor, the RST transistor, and the SEL transistor correspond to the four pixels Gb(1, 1), R1, Gb(1, 3), and R2.

Figure 14:
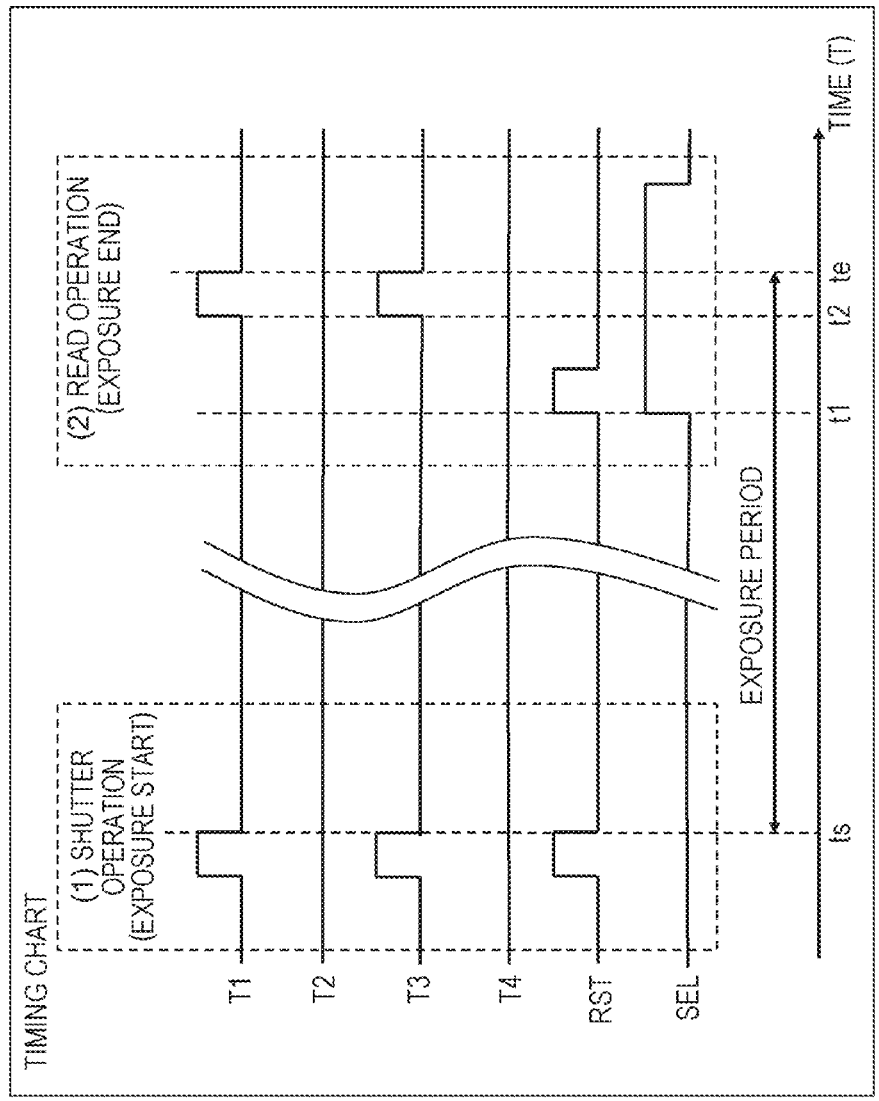
FIG. 14 is a diagram illustrating a timing chart describing an imaging sequence in the image processing apparatus according to the second embodiment.

In this structure, in the case in which the Gb(1, 1) pixel and the Gb(1, 3) pixel are added, as illustrated in a timing chart of FIG. 14, when read is performed, the control transistor T1 of the Gb(1, 1) pixel and the control transistor T3 of the Gb(1, 3) pixel may be set to "H" (ON) at the same time, at a time (t2).

By this process, electrons of a photodiode of each of the Gb(1, 1) pixel and the Gb(1, 3) pixel are added to an FD 311 of FIG. 13(b) and an addition signal is read through the SEL transistor.

Figure 15:
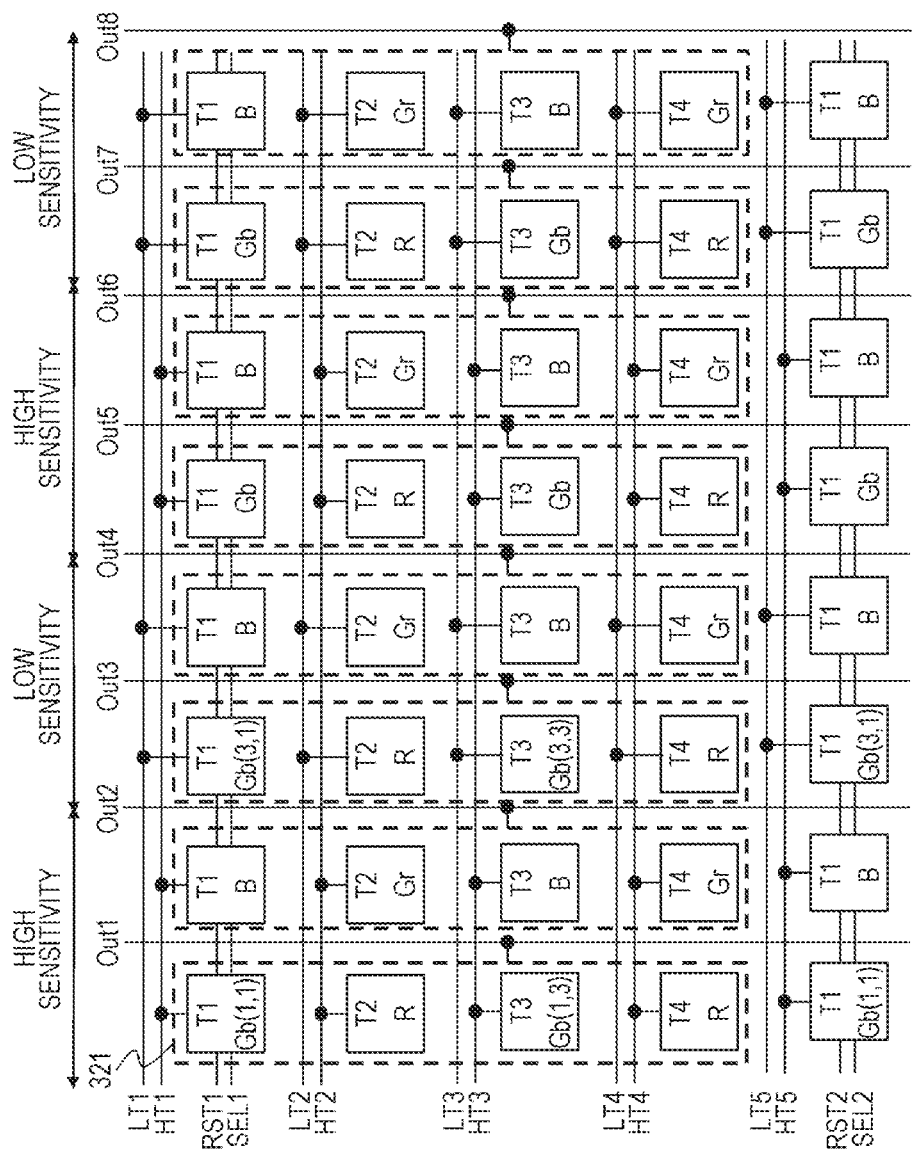
FIG. 15 is a diagram illustrating a circuit configuration of the pixel unit of the imaging device in the image processing apparatus according to the second embodiment.

FIG. 15 illustrates a pixel array in the sharing configuration of the transistor described with reference to FIG. 13, that is, the configuration in which the AMP transistor, the RST transistor, and the SEL transistor are shared by the pixel blocks in which the transistors are arranged in the four columns as one setting. The pixel block is shown by a dotted frame, like a pixel block 321.

Similar to the configuration of FIG. 6 described above, in a circuit of FIG. 15, as signal lines connected to a control transistor Tn of a pixel, two signal lines LT1 and HT1 are provided for each row. In this configuration, setting of the high sensitivity pixel and the low sensitivity pixel in units of two columns is realized.

The difference with the configuration of FIG. 6 is that a reset signal line (RST) and a selection signal line (SEL) are realized as one setting for a pixel block including four pixels of each column.

For example, the pixel block 321 includes four pixels included in a first column. However, one reset signal line (RST) and one selection signal line (SEL) are connected to the pixel block 321 including the four pixels.

This is to correspond to the transistor sharing configuration in which the AMP transistor, the RST transistor, and the SEL transistor are realized as one setting in a unit of the pixel block including the four pixels of one column, as described above with reference to FIG. 13(B).

By adopting this configuration, the transistor and the wiring configuration are simplified.

Figure 16:
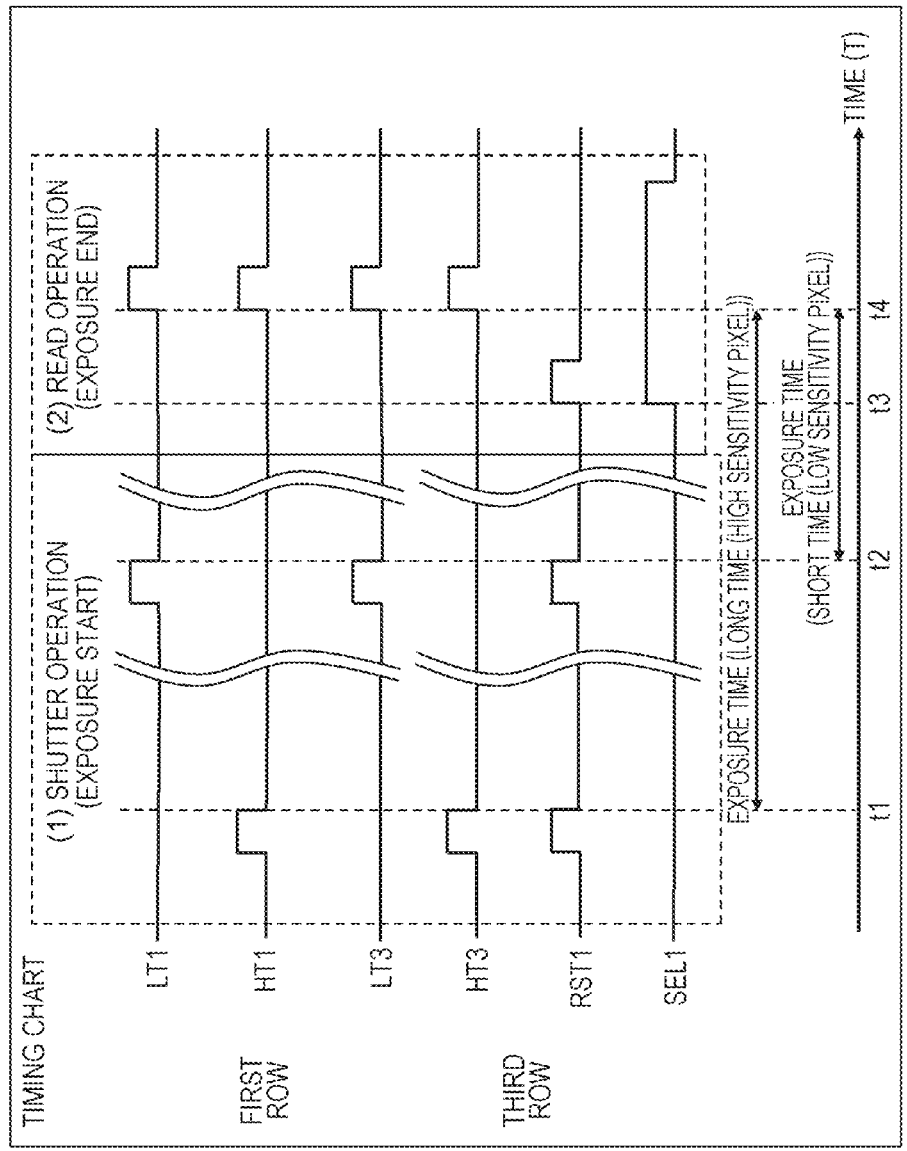
FIG. 16 is a diagram illustrating a timing chart describing an imaging sequence in the image processing apparatus according to the second embodiment.

FIG. 16 is a timing chart illustrating transmission timing of a control signal for the pixel unit of the transistor sharing type described in FIG. 13 or 15 and an exposure time control process of each pixel.

As described above with reference to FIG. 7, the normal CMOS sensor performs the operations that are broadly divided into the shutter operation and the read operation. The shutter operation is an operation when imaging (exposure) is started. In the shutter operation, as a physical state of a photodiode, a process for setting electrons to vacant by a reset process (RST signal ON and LT1 or HT1 signal ON) and starting accumulation of electrons according to a light reception amount at the same time (then, RST signal OFF and LT1 or HT1 signal OFF) is executed. The exposure is started by the shutter operation.

The exposure end is executed after timing is determined by the read operation.

During the read operation, a selection signal (SEL) to be a selection signal of a pixel of which a pixel value is read is set to ON, (RST) for a reset process of floating diffusion (FD) at this timing is set to ON, an FD accumulation charge based on noise before the exposure start is removed, the signal lines (L1 and H1) to operate a control transistor (T1) of each pixel are set to ON during an ON period of the selection signal (SEL), and a pixel value of a pixel in which both the selection signal (SEL) and signals of the signal lines (L1 and H1) become ON is read.

As described above, the pixel unit 151 of the imaging device 102 according to the present disclosure has a configuration in which the high sensitivity pixels and the low sensitivity pixels are alternately set in units of two columns in a strip shape in the vertical direction.

A read process of a pixel value from the pixel unit 151 is executed according to the following sequence.

(S1) A first row and a third row are read at the same time and two pixel values of the same column are added and output, (S2) A second row and a fourth row are read at the same time and two pixel values of the same column are added and output, (S3) A fifth row and a seventh row are read at the same time and two pixel values of the same column are added and output, (S4) A sixth row and an eighth row are read at the same time and two pixel values of the same column are added and output, . . . .

Hereinafter, pixel values of pixels of the same color of the same column of two rows with one row therebetween are read at the same time and the pixel values are added and output.

The timing chart illustrated in FIG. 16 illustrates an execution example of the shutter operation and the read operation as the process sequence of the first row and the third row.

First, at a time (t1), a reset signal (RST1) common to the first row and the third row, a control signal (HT1) functioning as an exposure start signal for only a high sensitivity pixel column of the first row and used to operate a control transistor T1 of the high sensitivity pixel, and a control signal (HT3) functioning as an exposure start signal for only a high sensitivity pixel column of the third row and used to operate the control transistor T3 of the high sensitivity pixel are set to High (ON).

By this process, the control transistors (T1 and T3) of the high sensitivity pixels of the first row and the third row connected to the signal lines HT1 and HT3 become ON, electrons in the photodiodes set to the high sensitivity pixel columns of the first row and the third row become vacant, and new charge accumulation according to subject light starts (high sensitivity pixel shutter operation).

Next, at a time (t2), a reset signal (RST1) common to the first row and the third row, a control signal (LT1) functioning as an exposure start signal for only a low sensitivity pixel column of the first row and used to operate a control transistor T1 of the low sensitivity pixel, and a control signal (LT3) functioning as an exposure start signal for only a low sensitivity pixel column of the third row and used to operate the control transistor T3 of the low sensitivity pixel are set to High (ON).

By this process, the control transistors (T1 and T3) of the low sensitivity pixels of the first row and the third row connected to the signal lines LT1 and LT3 become ON, electrons in the photodiodes set to the low sensitivity pixel columns of the first row and the third row become vacant, and new charge accumulation according to subject light starts (low sensitivity pixel shutter operation).

Next, the read operation is executed.

First, at a time (t3), for the first row and the third row to be addition target rows by simultaneous read, the reset signal (RST1) common to the first row and the third row and the selection signal (SEL1) common to the first row and the third row are set to High (ON) at the same time and resetting (RST) of the floating diffusion (FD) (FD 311 of FIG. 13) is performed.

By this process, the charge due to noise accumulated in the FD 311 illustrated in FIG. 13(*b*) to be set in units of four pixels is removed.

Next, at a time (t4) in a period during which the selection signal (SEL1) common to the first row and the third row is set to High (ON), all of the control signal (LT1) used to operate the transistor T1 of the low sensitivity pixel for only the low sensitivity pixel column of the first row, the control signal (HT1) used to operate the transistor T1 of the high sensitivity pixel for only the high sensitivity pixel column of the first row, the control signal (LT3) used to operate the transistor T1 of the low sensitivity pixel for only the low sensitivity pixel column of the third row, and the control signal (HT3) used to operate the transistor T1 of the high sensitivity pixel for only the high sensitivity pixel column of the third row are set to High (ON).

For the pixel values of the first row and the third row, pixel values of the same column are added and are output through one output line.

That is, an addition pixel value of two high sensitivity pixels of the first row and the third row is output from the high sensitivity pixel column including the pixel block 321 of the first column illustrated in FIG. 15, through output lines (Out1, Out2, Out5, Out6 . . . ).

In addition, an addition pixel value of two low sensitivity pixels of the first row and the third row is output from the low sensitivity pixel column illustrated in FIG. 15, through output lines (Out3, Out4, Out7, Out8 . . . ).

Here, addition of the two pixels of the vertical direction has been described. However, when the four pixels of the vertical direction are added, two pixels sharing the pixels are first added by the FD unit, respectively, and then, the two AMP transistors are operated at the same time as in the first embodiment, so that addition of a total of 4 pixels is enabled. In the same way as the above case, addition of 6 pixels, 8 pixels . . . are also enabled.

The pixel value addition/read process of the vertical direction from the pixel unit in this embodiment in the case of adopting the pixel unit configuration in which the transistors are shared by the plurality of pixels is as described above.

The following addition process of the horizontal direction is executed as the same process as the first embodiment described above.

(3-2. Third Embodiment)

Next, another example of the pixel unit configuration in which the transistors are shared by the plurality of pixels, similar to the second embodiment, will be described as a third embodiment with reference to FIG. 17 and the following drawings.

A pixel unit configuration according to the third embodiment illustrated in FIG. 17 is a transistor sharing configuration in which three transistors of an amplifying transistor (AMP), a reset transistor (RST), and a selection transistor (SEL) are realized as one setting in a unit of a pixel block including eight pixels of four high sensitivity pixels of a high sensitivity pixel column and four low sensitivity pixels of a low sensitivity pixel column.

A pixel block 351 illustrated in FIG. 17(*a*) is a pixel block including eight pixels of four high sensitivity pixels of a high sensitivity pixel column and four low sensitivity pixels of a low sensitivity pixel column and a circuit configuration of the pixel block becomes a configuration illustrated in FIG. 17(*b*).

As illustrated in FIG. 17(*b*), a high sensitivity pixel column 361 includes four high sensitivity pixels and a low sensitivity pixel column 362 includes four low sensitivity pixels.

The transistors of the amplifying transistor (AMP), the reset transistor (RST), and the selection transistor (SEL) are shared by a total of eight pixels as one setting.

The eight pixels also share an output line (Out). Therefore, an output of an addition pixel value of two pixels of the high sensitivity pixel column 361 and an output of an addition pixel value of two pixels of the low sensitivity pixel column 362 are executed alternately, that is, exclusively through one output line (Out).

Figure 18:
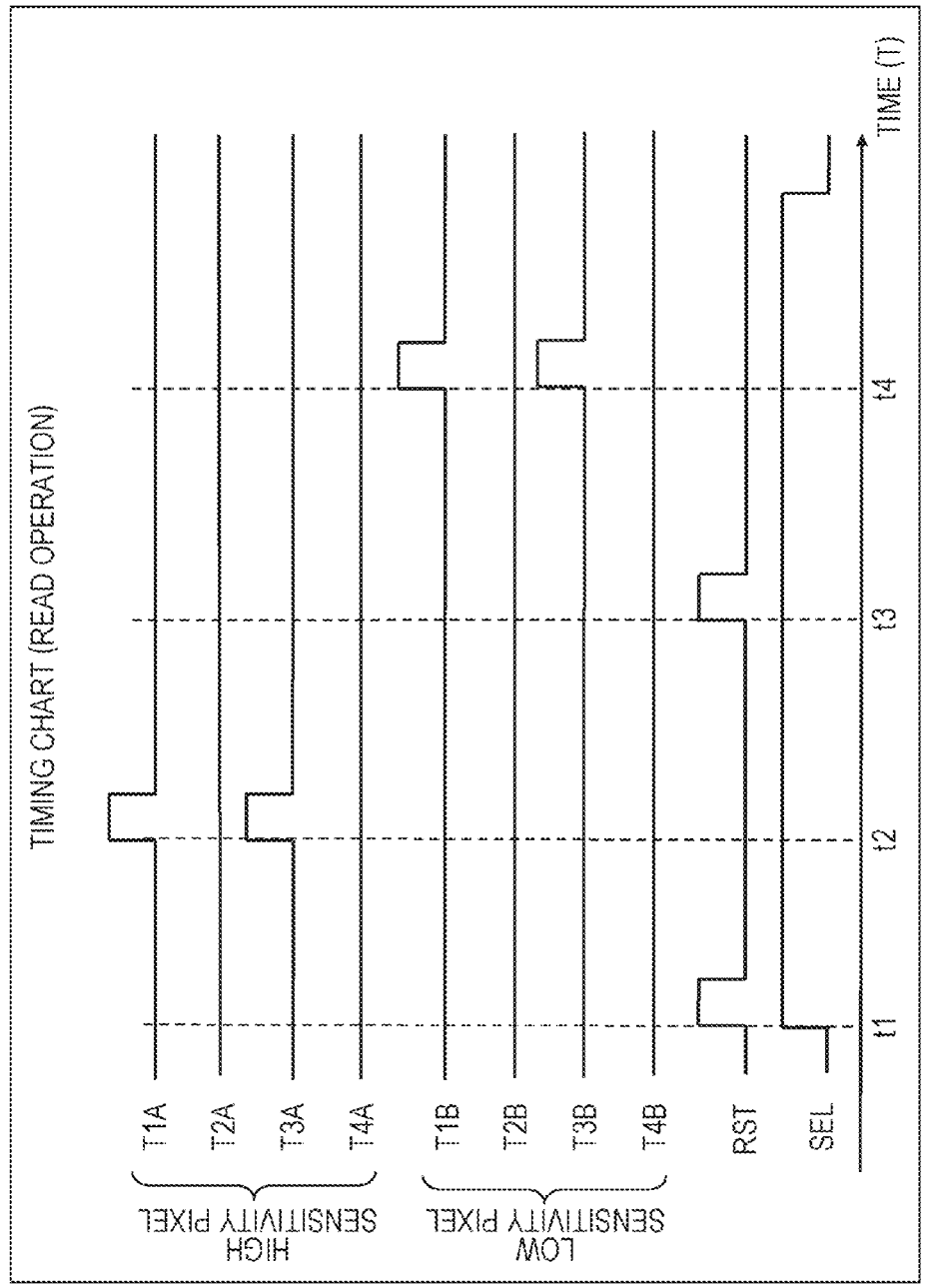
FIG. 18 is a diagram illustrating a timing chart describing an imaging sequence in the image processing apparatus according to the third embodiment.

A timing chart of a read operation is illustrated in FIG. 18.

As illustrated in FIG. 18, at a time t1, a reset signal (RST) common to a pixel block including eight pixels and a selection signal (SEL) common to the pixel block including the eight pixels are set as High (ON) at the same time and resetting (RST) of floating diffusion (FD) 371 illustrated in FIG. 17(*b*) is performed.

By this process, a charge due to noise accumulated in the FD 371 is removed.

At a time t2, control transistors T1A and T3A of two pixels becoming addition process targets of a high sensitivity pixel column are set to High and an addition pixel value of these pixels is output through an output signal line (Out).

Then, at a time t3, a reset signal (RST) common to a pixel block including eight pixels is set as High (ON) and resetting (RST) of the floating diffusion (FD) 371 illustrated in FIG. 17(*b*) is performed.

By this process, the charge due to the noise accumulated in the FD 371 is removed.

Then, at a time t4, control transistors T1B and T3B of two pixels becoming addition process targets of a low sensitivity pixel column are set to High and an addition pixel value of these pixels is output through the output signal line (Out).

As such, the output of the addition pixel value of the high sensitivity pixel column and the output of the addition pixel value of the low sensitivity pixel column are executed alternately through one output line.

Figure 19:
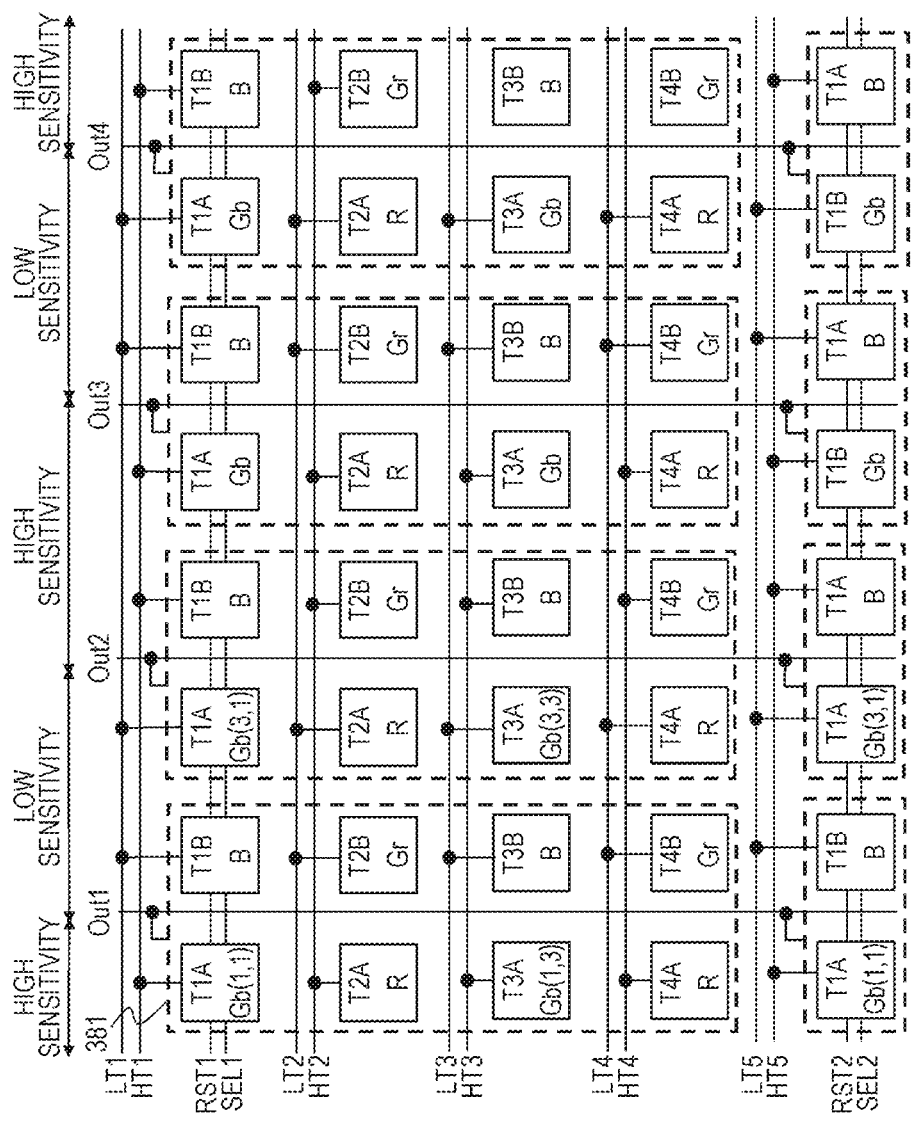
FIG. 19 is a diagram illustrating a circuit configuration of a pixel unit of the imaging device in the image processing apparatus according to the third embodiment.

FIG. 19 illustrates a pixel array in the sharing configuration of the transistor described with reference to FIG. 17, that is, the configuration in which the transistors of the AMP transistor, the RST transistor, and the SEL transistor are shared by the eight pixel blocks as one setting. The pixel block is shown by a dotted frame, like a pixel block 381.

Similar to the configuration of FIG. 6 or the configuration of FIG. 15 described above, in a circuit of FIG. 17, as signal lines connected to a control transistor Tn of a pixel, two signal lines LT1 and HT1 are provided for each row. In this configuration, setting of the high sensitivity pixel and the low sensitivity pixel in units of two columns is realized.

The difference with the configuration of FIG. 6 or FIG. 15 is that a reset signal line (RST) and a selection signal line (SEL) are realized as one setting for a pixel block of a total of eight pixels including four pixels of high sensitivity pixels and four pixels of low sensitivity pixels.

For example, the pixel block 371 includes a total of eight pixels of four high sensitivity pixels included in a first column and four low sensitivity pixels of a second column. However, one reset signal line (RST) and one selection signal line (SEL) are connected to the pixel block 381 including the eight pixels.

This is to correspond to the transistor sharing configuration in which the AMP transistor, the RST transistor, and the SEL transistor are realized as one setting in a unit of the pixel block including the total of eight pixels of the four high sensitivity pixels and the four low sensitivity pixels, as described above with reference to FIG. 17(B).

By adopting this configuration, the transistor and the wiring configuration are simplified.

Figure 20:
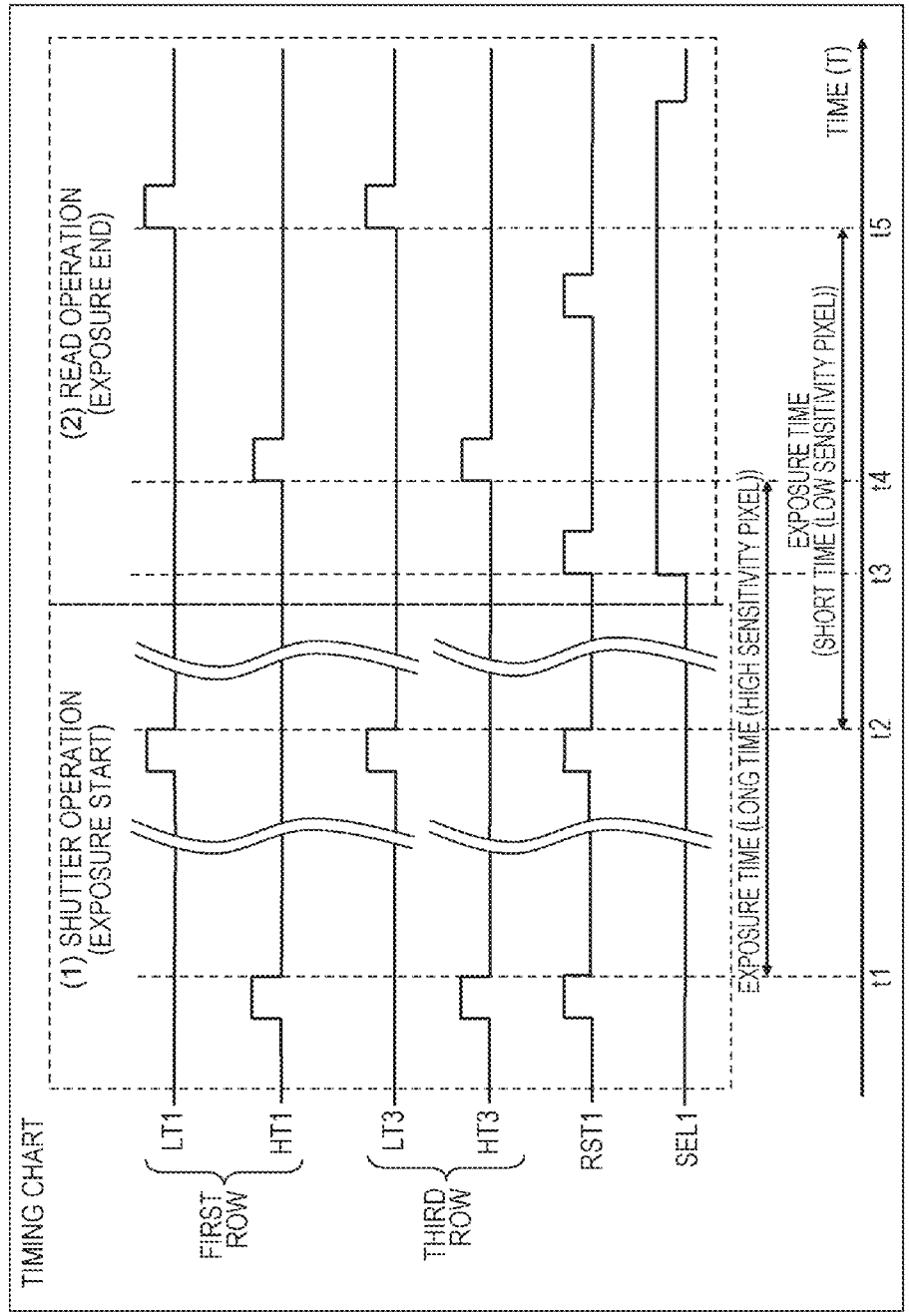
FIG. 20 is a diagram illustrating a timing chart describing an imaging sequence in the image processing apparatus according to the third embodiment.

FIG. 20 is a timing chart illustrating transmission timing of a control signal for the pixel unit of the transistor sharing type illustrated in FIG. 17 or FIG. 19 and an exposure time control process of each pixel.

In this configuration, as described with reference to FIG. 18, simultaneous read of an addition value of two pixels of high sensitivity pixels and an addition value of two pixels of low sensitivity pixels is disabled.

Therefore, a read sequence is as follows.

(S1) High sensitivity pixels of a first row and a third row are read at the same time and pixel values of the two high sensitivity pixels of the same column are added and output, (S2) Low sensitivity pixels of the first row and the third row are read at the same time and pixel values of the two low sensitivity pixels of the same column are added and output, (S3) High sensitivity pixels of a second row and a fourth row are read at the same time and pixel values of the two high sensitivity pixels of the same column are added and output, (S4) Low sensitivity pixels of the second row and the fourth row are read at the same time and pixel values of the two low sensitivity pixels of the same column are added and output, . . . .

Hereinafter, this process is executed such that high sensitivity pixel read and low sensitivity pixel read are alternately performed in units of two rows with one row therebetween.

A timing chart illustrated in FIG. 20 illustrates an execution example of the shutter operation and the read operation as the process sequence of the first row and the third row.

First, at a time (t1), a reset signal (RST1) common to the first row and the third row and set in units of eight pixels, a control signal (HT1) functioning as an exposure start signal for only a high sensitivity pixel column of the first row and used to operate a control transistor T1A of the high sensitivity pixel, and a control signal (HT3) functioning as an exposure start signal for only a high sensitivity pixel column of the third row and used to operate the control transistor T3A of the high sensitivity pixel are set to High (ON).

By this process, the control transistors (T1A and T3A) of the high sensitivity pixels of the first row and the third row connected to the signal lines HT1 and HT3 become ON and electrons in the photodiodes set to the high sensitivity pixel columns of the first row and the third row become vacant. Then, these signals are set to OFF, so that new charge accumulation according to subject light starts (high sensitivity pixel shutter operation).

Next, at a time (t2), a reset signal (RST1) common to the first row and the third row and set in units of eight pixels, a control signal (LT1) functioning as an exposure start signal for only a low sensitivity pixel column of the first row and used to operate a control transistor T1B of the low sensitivity pixel, and a control signal (LT3) functioning as an exposure start signal for only a low sensitivity pixel column of the third row and used to operate a control transistor T3B of the low sensitivity pixel are set to High (ON).

By this process, the control transistors (T1B and T3B) of the low sensitivity pixels of the first row and the third row connected to the signal lines LT1 and LT3 become ON and electrons in the photodiodes set to the low sensitivity pixel columns of the first row and the third row become vacant. Then, these signals are set to OFF, so that new charge accumulation according to subject light starts (low sensitivity pixel shutter operation).

Next, the read operation is executed.

First, at a time (t3), for the first row and the third row to be addition target rows by simultaneous read, a reset signal (RST1) common to the first row and the third row and set in units of eight pixels and a selection signal (SEL1) common to the first row and the third row and set in units of eight pixels are set to High (ON) at the same time and resetting (RST) of the floating diffusion (FD) (FD 371 of FIG. 17) is performed.

By this process, a charge due to noise accumulated in the FD 371 illustrated in FIG. 17(b) to be set in units of eight pixels is removed.

Next, at a time (t4) in a period during which the selection signal (SEL1) common to the first row and the third row and set in units of eight pixels is set to High (ON), the control signal (HT1) used to operate the transistor T1A for only the high sensitivity pixel column of the first row and the control signal (HT3) used to operate the transistor T1A for only the high sensitivity pixel column of the third row are set to High (ON).

By this process, pixel values of the high sensitivity pixels of the first row and the third row are added and are output through one output line.

Next, at a time (t5) in a period during which the selection signal (SEL1) common to the first row and the third row and set in units of eight pixels is set to High (ON), the control signal (LT1) used to operate the transistor T1B for only the low sensitivity pixel column of the first row and the control signal (LT3) used to operate the transistor T3B for only the low sensitivity pixel column of the third row are set to High (ON).

By this process, pixel values of the high sensitivity pixels of the first row and the third row are added and are output through one output line.

As such, as the pixel values of the first row and the third row, an addition value of the high sensitivity pixels and an addition value of the low sensitivity pixels are output with a time difference, through one output line.

Even in this embodiment, addition of the two pixels of the vertical direction has been described. However, when the four pixels of the vertical direction are added, two pixels sharing the pixels are first added by the FD unit, respectively, and then, the two AMP transistors are operated at the same time as in the first embodiment, so that addition of a total of four pixels is enabled. In the same way as the above case, addition of six pixels, eight pixels . . . are also enabled.

The pixel value addition/read process of the vertical direction from the pixel unit in this embodiment in the case of adopting the pixel unit configuration in which the transistors are shared by the plurality of pixels is as described above.

The following addition process of the horizontal direction is executed as the same process as the first embodiment described above.

(3-3. Fourth Embodiment)

Figure 21:
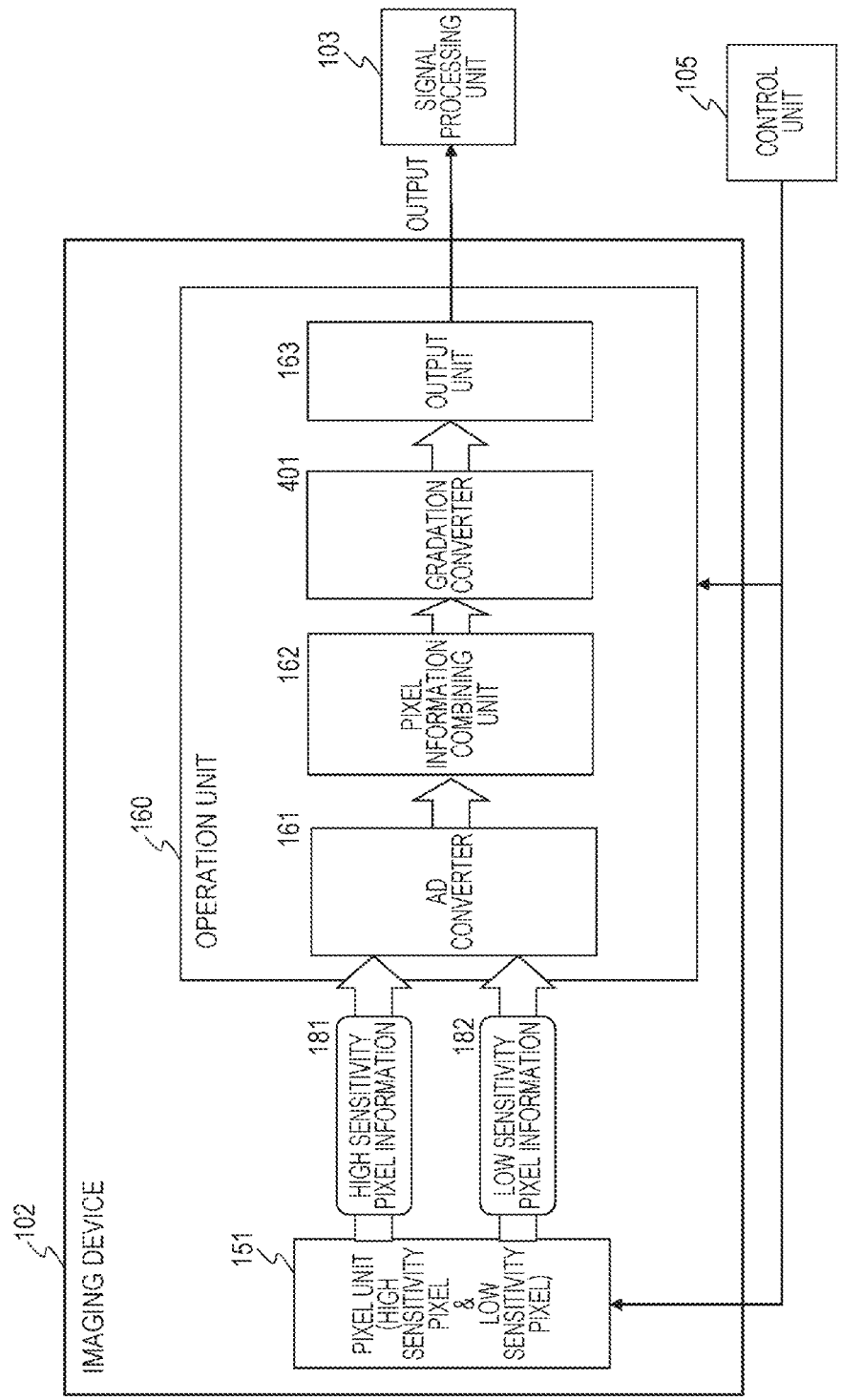
FIG. 21 is a diagram illustrating a configuration and a process of an imaging device in an image processing apparatus according to a fourth embodiment.

Next, an embodiment in which a gradation converter 401 is configured at the back of a pixel information combining unit 162 of an operation unit 160 of an imaging device 102 as illustrated in FIG. 21 will be described as a fourth embodiment of the present invention.

FIG. 21 is a diagram illustrating a configuration of the imaging device 102 according to the fourth embodiment. The configuration illustrated in FIG. 21 is a configuration in which the gradation converter 402 is provided at the back of the pixel information combining unit 162 of the operation unit 160 of the imaging device 102, which is described above as the first embodiment and is illustrated in FIG. 3. The other configuration is the same as the configuration of the first embodiment illustrated in FIG. 3. An entire configuration of an imaging processing apparatus (imaging apparatus) is the same as the configuration described above with reference to FIG. 2, similar to the first embodiment.

In the imaging device 102 illustrated in FIG. 21, a pixel unit 151 has a Bayer array including RGbGrB pixels, similar to the embodiment described above. Long time exposure and short time exposure are executed in units of two columns, under the control of the control unit 105.

In the pixel unit 151, different exposure times are set in units of pixel regions (for example, units of columns) by the control (shutter control) of the control unit 105. High sensitivity pixel information 181 to be an accumulation change based on the long time exposure is output from a long time exposure pixel. In addition, low sensitivity image information 182 to be an accumulation change based on short time exposure is output from a short time exposure pixel.

The operation unit 160 inputs the high sensitivity pixel information 181 and the low sensitivity pixel information 182 output from the pixel unit 151 and generates one pixel information combination image in the pixel information combining unit 162 on the basis of the input information. The combination process is executed as the same process as the combination process described in the previous embodiment. That is, the high sensitivity pixel information and the low sensitivity pixel information of the same color are input, the (expression 1) described above is applied, pixel value calculation of a pixel information combination image is executed, and the pixel information combination image is generated.

In the fourth embodiment, the gradation converter 401 is provided at the back of the pixel information combining unit 162.

The gradation converter 401 converts a gradation of a pixel value of each pixel of the pixel information combination image (for example, FIG. 4(b)) generated by the pixel information combining unit 162. Specifically, when the pixel value of each pixel of the pixel information combination image generated by the pixel information combining unit 162 has a gradation of 14 bits (0 to 16383), a process for converting the gradation of the pixel value of each pixel into 10 bits (0 to 1023) and outputting the pixel value is executed. That is, an image in which the number of bits of each pixel is reduced is generated and output.

In a wide dynamic range image that is generated by combining a long time exposure image and a short time exposure image, the number of bits to be information of each pixel tends to increase. For example, in an imaging element in which the number of bits is 10 bits in a normal state, when a selectivity ratio of 16 times is maintained inside and a wide dynamic range image of 16 times is generated, the number of bits becomes 14 bits. An image in which the number of bits has increased may not be processed by a DSP to be a signal processing unit of a subsequent step. In order to prevent such a situation, the gradation converter 401 executes a gradation conversion process for compressing the number of bits of each pixel to a bit level that can be processed by the DSP to be the signal processing unit of the subsequent step.

Figure 22:
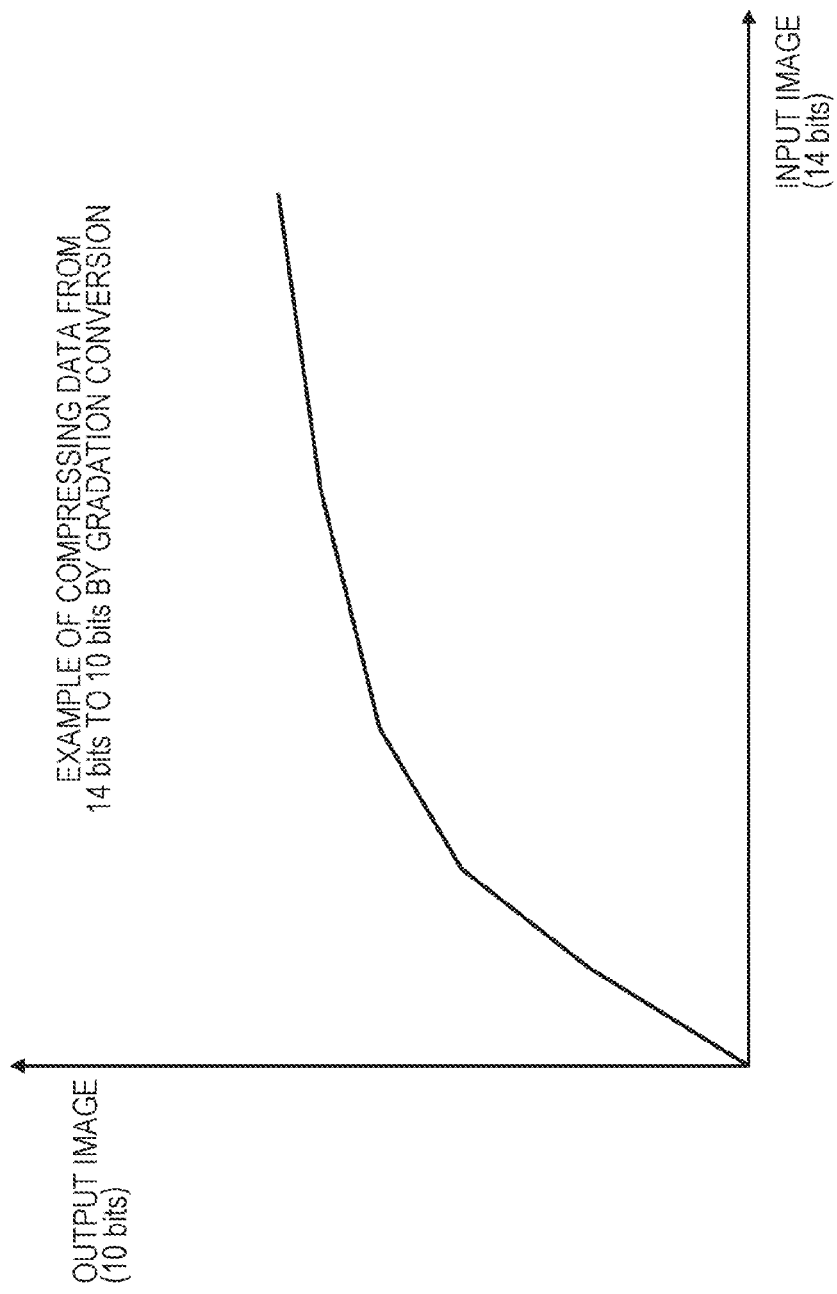
FIG. 22 is a diagram illustrating a specific example of an execution process of a gradation converter set to the imaging device of the image processing apparatus according to the fourth embodiment.

An example of the bit number compression process that is executed by the gradation converter 401 will be described with reference to FIG. 22. In FIG. 22, a horizontal axis shows a gradation [14 bits (0 to 16383)] of each pixel of an input image of the gradation converter 401 and a vertical axis shows a gradation [10 bits (0 to 1023)] of each pixel in an output image after the gradation conversion. As such, the gradation converter 401 executes a process for reducing pixel values of multiple gradations output by the pixel information combining unit 162 to the smaller number of bits.

Image data after the gradation conversion, for example, an image in which each pixel is configured by 10-bit data is provided to a signal processing unit 103 (DSP) of a following step, so that a process is enabled in the signal processing unit 103 (DSP) without causing a problem.

Furthermore, the bit number compression process that is executed by the gradation converter 401 reduces the number of bits using a function. This function may be determined from the beginning and a function according to an image may be input from the outside or may be calculated inside.

(3-4. Fifth Embodiment)

Next, an embodiment in which a signal processing unit to execute a camera signal process such as demosaic or noise reduction (NR) or a codec to execute an image compression (such as JPEG) process are provided at the back of the gradation converter described in the fourth embodiment will be described as a fifth embodiment of an image processing apparatus according to the present disclosure with reference to FIG. 23.

Figure 23:
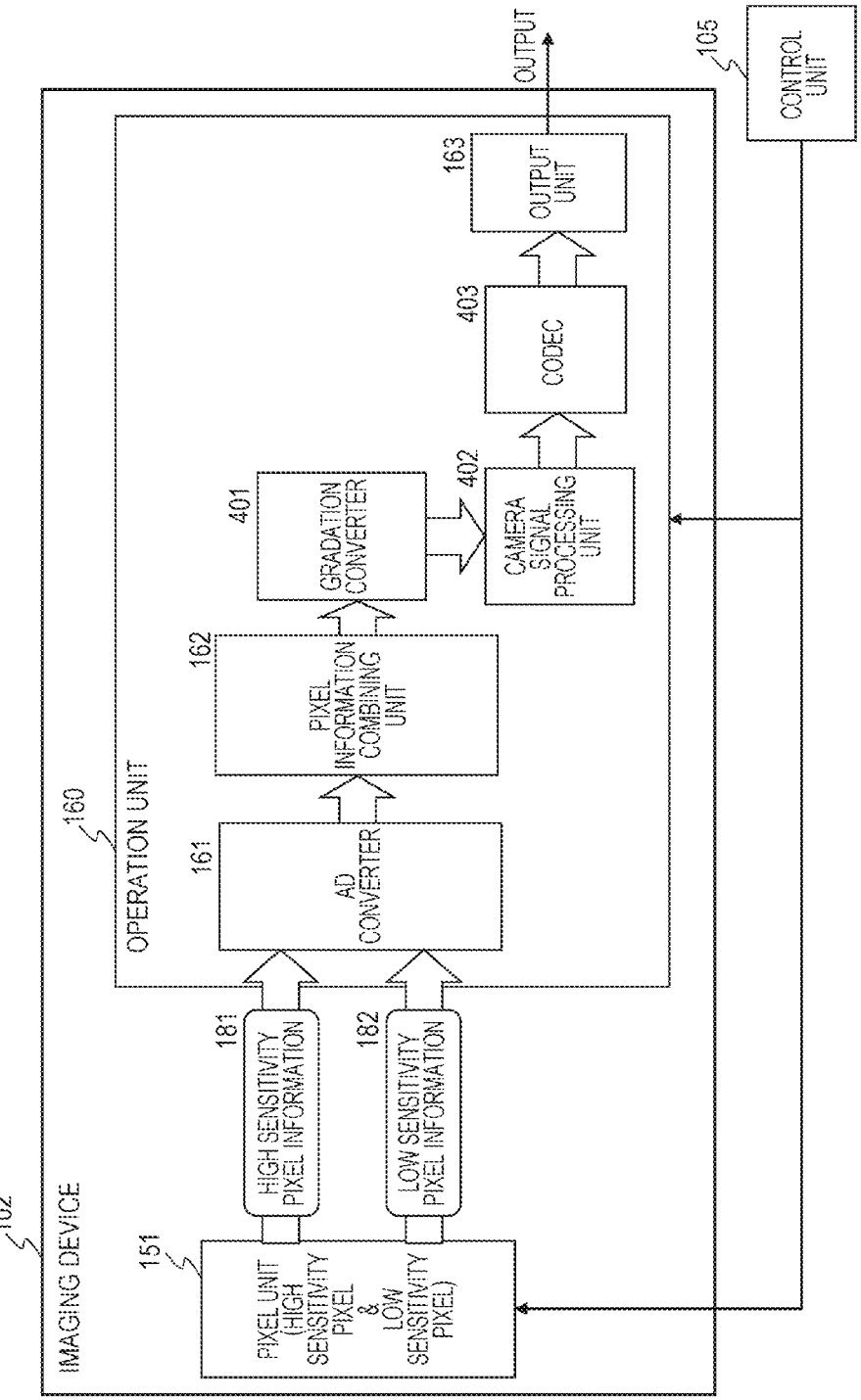
FIG. 23 is a diagram illustrating a configuration and a process of an imaging device in an image processing apparatus according to a fifth embodiment.

FIG. 23 is a diagram illustrating a configuration of an imaging device 102 according to the fifth embodiment. The configuration illustrated in FIG. 23 is a configuration in which individual components of a gradation converter 401, a signal processing unit 402 to execute a camera signal process such as demosaic or noise reduction (NR), and a codec 403 to execute an image compression (such as JPEG) process are added to the back of the pixel information combining unit 162 of the operation unit 160 of the imaging device illustrated in FIG. 3 and described above as the first embodiment. An entire configuration of an imaging processing apparatus (imaging apparatus) is the same as the configuration described above with reference to FIG. 2 or a configuration in which the signal processing unit 103 is omitted from the configuration of FIG. 2, similar to the first embodiment.

When all of the processes executed by the signal processing unit 103 of the configuration of FIG. 2 are executed by the signal processing unit 402 of FIG. 23, the signal processing unit 103 of the subsequent step can be omitted. When a different process is executed in each signal processing unit, a configuration in which two signal processing units are included may be adopted.

In the imaging device 102 illustrated in FIG. 23, a process from the pixel unit 151 to the pixel information combining unit 162 becomes the same process as the embodiment described above.

A process of the gradation converter 401 is the same process as the fourth embodiment described above.

In the fifth embodiment, the signal processing unit 402 to execute the camera signal process such as the demosaic or the noise reduction (NR) and the codec 403 to execute the image compression (such as JPEG) process are included. By mounting this function, the signal processing unit of the subsequent step of the imaging element can be omitted or simplified.

(3-5. Sixth Embodiment)

Next, a change example of a pixel array of the pixel unit 151 of the imaging device 102, specifically, a color filter array set to the pixel unit 151 will be described as a sixth embodiment of an image processing apparatus according to the present disclosure.

In each embodiment described above, for example, as illustrated in FIG. 4, the process in the imaging apparatus that has the pixel unit 151 having the configuration in which 4 pixels of 2×2 including four different pixels of Gb, B, R, and Gr is set as a minimum unit and the minimum unit is repetitively arranged has been described.

A process according to the present disclosure can be applied to other pixel array (color filter array).

For example, FIG. 24 illustrates a pixel array (color filter array) of the pixel unit 151 of the imaging device 102 according to the sixth embodiment.

The pixel array of the pixel unit 151 illustrated in FIG. 24 has a configuration in which a total of 4×4 pixels of Gb pixels of 2×2, B pixels of 2×2, R pixels of 2×2, and Gr pixels of 2×2 are set as a minimum unit and the minimum unit is repetitively arranged. As illustrated in FIG. 24, the same colors are arranged in 2×2.

Setting of the high sensitivity pixels and the low sensitivity pixels in the pixel array illustrated in FIG. 24 will be described with reference to FIG. 25.

In this embodiment, as illustrated in FIG. 25(a), the high sensitivity pixels and the low sensitivity pixels are set in a staggered shape in a column direction. White pixel regions illustrated in the drawing show the high sensitivity pixels and gray pixel regions show the low sensitivity pixels.

For example, setting [coordinates (x, y)] of 4 Gb pixels of an upper left end of FIG. 25(a) is as follows.

Gb(1, 1): high sensitivity pixel
Gb(2, 1): low sensitivity pixel
Gb(1, 2): low sensitivity pixel
Gb(2, 2): high sensitivity pixel As such, the high sensitivity pixels and the low sensitivity pixels are alternately set in each column and the high sensitivity pixels and the low sensitivity pixels are alternately set in each row.

As illustrated in the drawing, if only the high sensitivity pixels are traced in a y direction in the first column and the second column, from the upper side, the first column is the high sensitivity pixel in the first row, the second column is the high sensitivity pixel in the second row, the first column is the high sensitivity pixel in the third row, the second column is the high sensitivity pixel in the fourth row, . . . .

As such, the high sensitivity pixels are arranged in a staggered shape.

Likewise, if only the low sensitivity pixels are traced in the y direction in the first column and the second column, from the upper side, the second column is the low sensitivity pixel in the first row, the first column is the low sensitivity pixel in the second row, the second column is the low sensitivity pixel in the third row, the first column is the low sensitivity pixel in the fourth row, . . . .

As such, the low sensitivity pixels are arranged in a staggered shape.

In this configuration, pixels of the same color are set in units of 2×2 pixels and the two high sensitivity pixels and the two low sensitivity pixels are included in the four pixels.

The operation unit 160 of the imaging device 102 inputs high sensitivity pixel information generated by pixel values of the high sensitivity pixels and low sensitivity pixel information generated by pixel values of the low sensitivity pixels, combines the pixel information of the different sensitivities, and calculates one pixel value of an output image.

Figure 25:
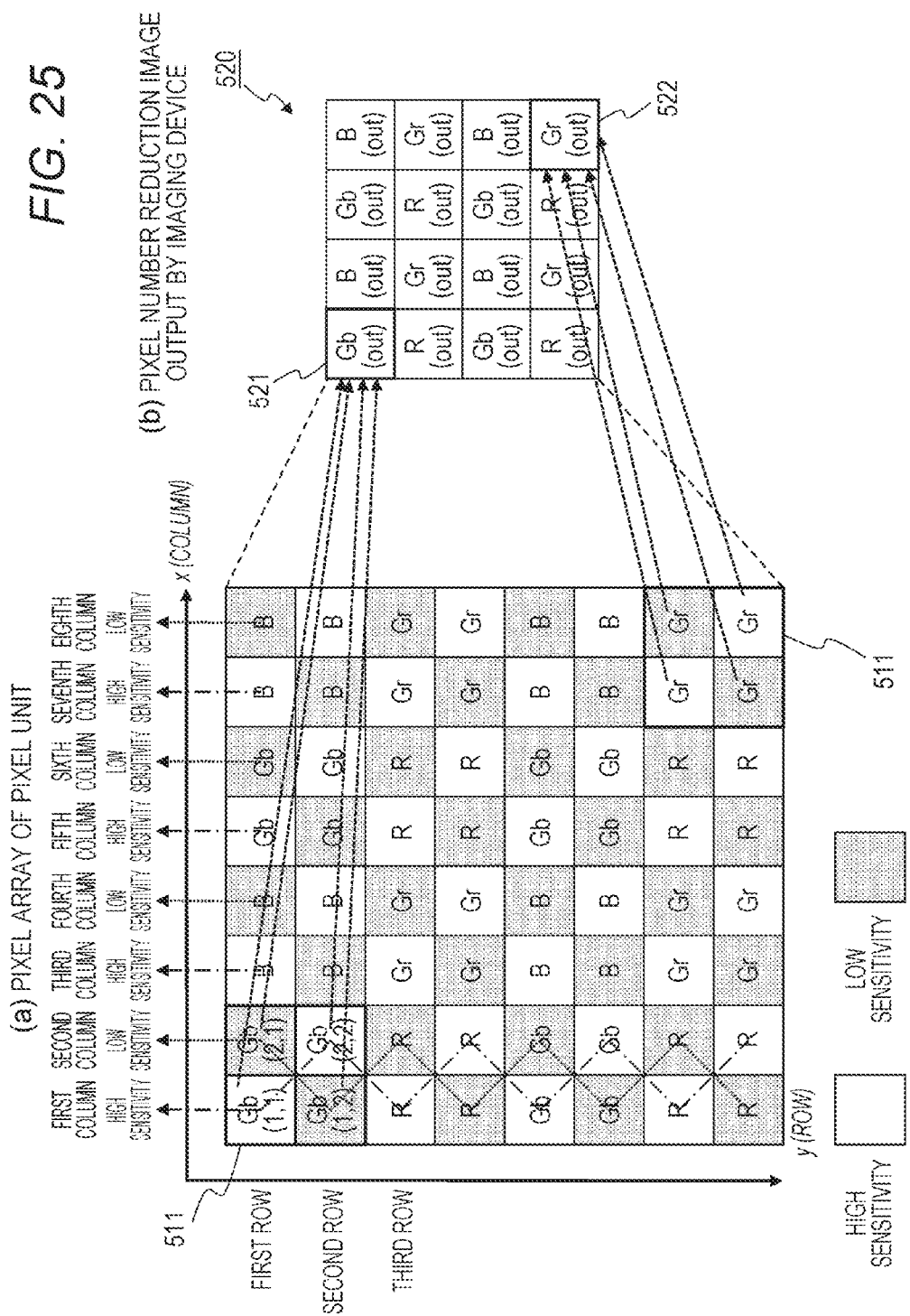
FIG. 25 is a diagram illustrating a specific example of a pixel information combination process.

Specifically, one Gb pixel value is calculated from two high sensitivity Gb pixels and two low sensitivity Gb pixels included in a 2×2 pixel region of the same color, for example, a 2×2 pixel region 511 to be a Gb pixel region of an upper left end illustrated in FIG. 25 and a pixel value of one pixel 521 of an output image 520 illustrated in FIG. 25(B) is calculated.

The imaging device 102 generates an image obtained by reducing the original number of pixels of the pixel unit 151 to ¼, that is, a pixel number reduction image 520 illustrated in FIG. 25(b) and outputs the pixel number reduction image.

In the configuration illustrated in FIG. 4 described above, the output pixel value is determined using the two high sensitivity pixels and the two low sensitivity pixels of the same color included in the 3×3 pixel region 211. However, in this embodiment, a unit of an operation for calculating an output pixel value can be set as a 2×2 pixel region.

A circuit configuration of the pixel unit according to this embodiment becomes the same configuration as the configuration illustrated in FIG. 17 that has been described as the circuit configuration of the pixel unit of the imaging device in the image processing apparatus according to the third embodiment.

Figure 26:
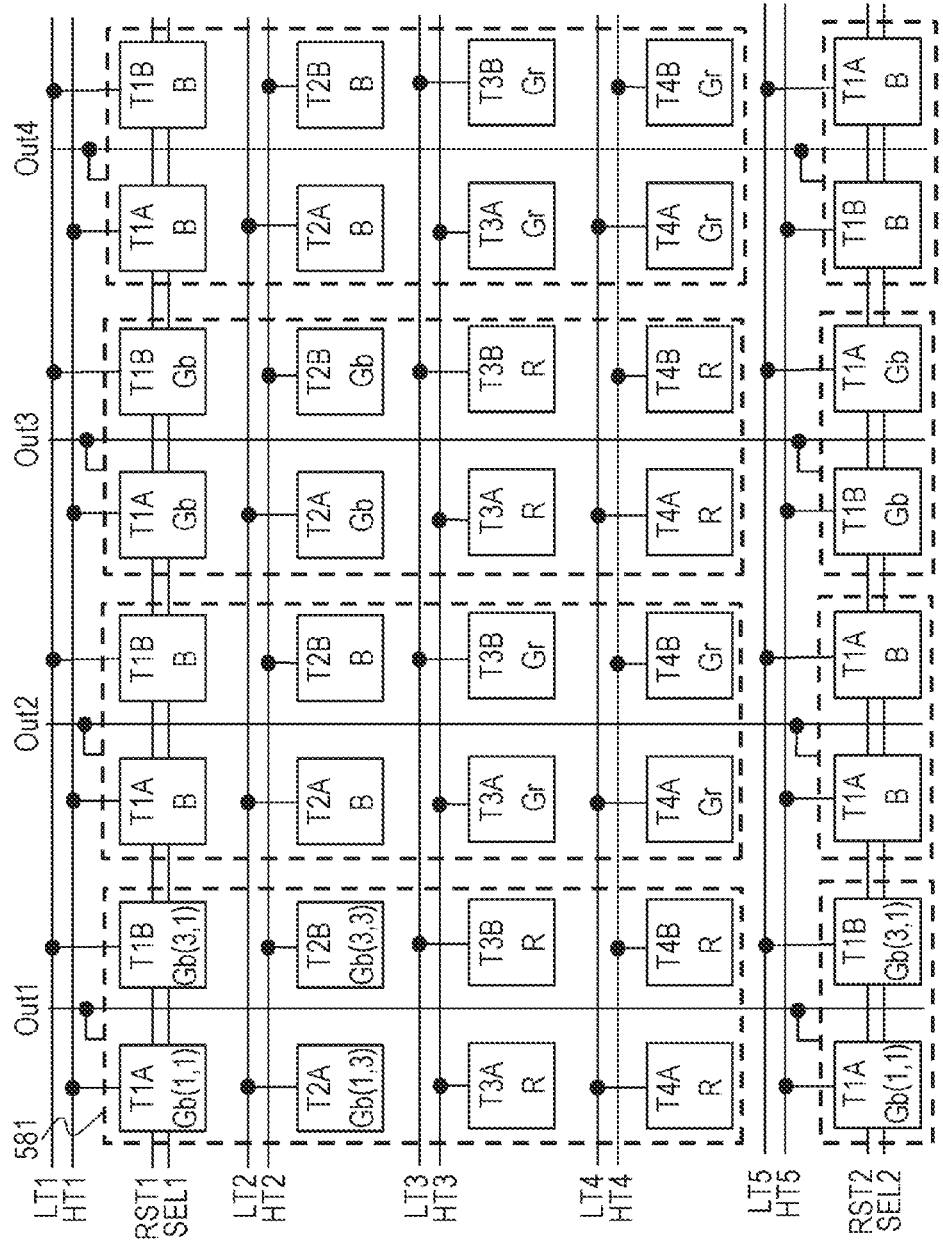
FIG. 26 is a diagram illustrating a circuit configuration of a pixel unit of an imaging device in an image processing apparatus according to a sixth embodiment.

FIG. 26 is a diagram illustrating a circuit configuration of the pixel unit of the imaging device according to this embodiment.

Similar to the transistor sharing configuration described above with reference to FIG. 17, the configuration in which the transistors of the AMP transistor, the RST transistor, and the SEL transistor are shared by the eight pixel blocks as one setting is adopted.

A pixel block that becomes a transistor sharing unit is shown by a dotted frame, like a pixel block 581.

As signal lines connected to a control transistor Tn of a pixel, two signal lines LT1 and HT1 are provided for each row. In this configuration, setting of the high sensitivity pixels and the low sensitivity pixels is realized in a staggered shape in a column direction.

FIG. 27 is a timing chart illustrating transmission timing of a control signal for the pixel unit of the transistor sharing type illustrated in FIG. 17 or FIG. 26 and an exposure time control process of each pixel.

Because this configuration has the transistor sharing configuration described with reference to FIG. 17, similar to the third embodiment described above, a read process according to the timing chart illustrated in FIG. 18 is executed and simultaneous read of a two pixel addition value of the high sensitivity pixels and a two pixel addition value of the low sensitivity pixels is disabled.

Therefore, a read sequence in this embodiment is executed by the following setting.

(S1) The high sensitivity pixels of the first row and the second row are read at the same time and pixel values of the two high sensitivity pixels to be obliquely positioned are added and output, (S2) The low sensitivity pixels of the first row and the second row are read at the same time and pixel values of the two low sensitivity pixels to be obliquely positioned are added and output, (S3) The high sensitivity pixels of the third row and the fourth row are read at the same time and pixel values of the two high sensitivity pixels to be obliquely positioned are added and output, (S4) The low sensitivity pixels of the third row and the fourth row are read at the same time and pixel values of the two low sensitivity pixels to be obliquely positioned are added and output, . . . .

Hereinafter, this process is executed such that high sensitivity pixel read and low sensitivity pixel read are alternately performed in units of two rows.

In this embodiment, the control unit 105 executes exposure time control in units of pixels of the pixel unit 151 and the pixel unit 151 outputs high sensitivity pixel information obtained by adding pixel values of a plurality of different high sensitivity pixels in which long time exposure is performed and low sensitivity pixel information obtained by adding pixel values of a plurality of different low sensitivity pixels in which short time exposure is performed.

Specifically, the pixel unit 151 outputs high sensitivity pixel information obtained by adding pixel values of two high sensitivity pixels which are included in a 2×2 pixel region and in which longtime exposure is performed and low sensitivity pixel information obtained by adding pixel values of two low sensitivity pixels which are included in a 2×2 pixel region and in which short time exposure is performed.

A timing chart illustrated in FIG. 27 illustrates an execution example of the shutter operation and the read operation as the process sequence of the first row and the second row.

First, at a time (t1), a reset signal (RST1) common to the first row and the second row and set in units of 8 pixels, a control signal (HT1) functioning as an exposure start signal for only a high sensitivity pixel column of the first row and used to operate a control transistor T1A of the high sensitivity pixel, and a control signal (HT2) functioning as an exposure start signal for only a high sensitivity pixel column of the second row and used to operate a control transistor T2B of the high sensitivity pixel are set to High (ON).

By this process, the control transistors (T1A and T2B) of the high sensitivity pixels of the first row and the second row connected to the signal lines HT1 and HT2 become ON and electrons in the photodiodes set to the high sensitivity pixel columns of the first row and the second row become vacant. Then, these signals are set to OFF, so that new charge accumulation according to subject light starts (high sensitivity pixel shutter operation).

Next, at a time (t2), a reset signal (RST1) common to the first row and the second row and set in units of 8 pixels, a control signal (LT1) functioning as an exposure start signal for only a low sensitivity pixel column of the first row and used to operate a control transistor T1B of the low sensitivity pixel, and a control signal (LT2) functioning as an exposure start signal for only a low sensitivity pixel column of the second row and used to operate a control transistor T2A of the low sensitivity pixel are set to High (ON).

By this process, the control transistors (T1B and T2A) of the low sensitivity pixels of the first row and the second row connected to the signal lines LT1 and LT2 become ON and electrons in the photodiodes set to the low sensitivity pixel columns of the first row and the second row become vacant. Then, these signals are set to OFF, so that new charge accumulation according to subject light starts (low sensitivity pixel shutter operation).

Next, the read operation is executed.

First, at a time (t3), for the first row and the second row to be addition target rows by simultaneous read, the reset signal (RST1) common to the first row and the second row and set in units of 8 pixels and the selection signal (SEL1) common to the first row and the second row and set in units of 8 pixels are set to High (ON) at the same time and resetting (RST) of the floating diffusion (FD) (FD 371 of FIG. 17) is performed.

By this process, the charge due to noise accumulated in the FD 371 illustrated in FIG. 17(*b*) to be set in units of 8 pixels is removed.

Next, at a time (t4) in a period during which the selection signal (SEL1) common to the first row and the second row and set in units of 8 pixels is set to High (ON), all of the control signal (HT1) used to operate the transistor T1A for only the high sensitivity pixel column of the first row and the control signal (HT2) used to operate the transistor T2B for only the high sensitivity pixel column of the second row are set to High (ON).

By this process, pixel values of the high sensitivity pixels of the first row and the second row are added and are output through one output line.

Next, at a time (t5) in a period during which the selection signal (SEL1) common to the first row and the second row and set in units of 8 pixels is set to High (ON), all of the control signal (LT1) used to operate the control transistor T1B for only the low sensitivity pixel column of the first row and the control signal (LT2) used to operate the transistor T2A for only the low sensitivity pixel column of the second row are set to High (ON).

By this process, pixel values of the low sensitivity pixels of the first row and the second row are added and are output through one output line.

As such, as the pixel values of the first row and the second row, an addition value of the high sensitivity pixels and an addition value of the low sensitivity pixels are output with a time difference, through one output line.

The pixel value addition/read process of the vertical direction from the pixel unit in this embodiment in the case of adopting the pixel unit configuration in which the transistors are shared by the plurality of pixels is as described above.

Then, the image combination is performed from the added high sensitivity pixels and the added low sensitivity pixels. However, this is executed as the same process as the addition process of the horizontal direction of the first embodiment.

FIG. 28 illustrates a modification of the sixth embodiment. A control transistor and a control signal line connected to the control transistor are changed, so that the sensitivity array of the staggered shape of the column direction like FIG. 28 can be applied.

In the pixel array illustrated in FIG. 28, pixels of the same color are set in units of 2×2 pixels, similar to the cases described with reference to FIGS. 24 and 25.

However, setting aspects of the high sensitivity pixels and the low sensitivity pixels become different from each other.

As illustrated in the drawing, in the second row and the following rows, the high sensitivity pixels and the low sensitivity pixels are arrayed in a staggered shape in units of two rows.

For example, if only the high sensitivity pixels are traced in a y direction in the first column and the second column, from the upper side, the first column is the high sensitivity pixel in the first row, the second column is the high sensitivity pixel in the second row, the second column is the high sensitivity pixel in the third row, the first column is the high sensitivity pixel in the fourth row, . . . .

As such, in the second row and the following rows, the high sensitivity pixels are arranged in a staggered shape in units of two rows.

Likewise, if only the low sensitivity pixels are traced in the y direction in the first column and the second column, from the upper side, the second column is the low sensitivity pixel in the first row, the first column is the low sensitivity pixel in the second row, the first column is the low sensitivity pixel in the third row, the second column is the low sensitivity pixel in the fourth row, . . . .

As such, in the second row and the following rows, the low sensitivity pixels are arranged in a staggered shape in units of two rows.

In this configuration, pixels of the same color are set in units of 2×2 pixels and the two high sensitivity pixels and the two low sensitivity pixels are included in the four pixels.

The operation unit 160 of the imaging device 102 inputs the high sensitivity pixel information and the low sensitivity pixel information, combines the pixel information of the different sensitivities, and sets one pixel value of an output image.

Specifically, one Gb pixel value is calculated from two high sensitivity Gb pixels and two low sensitivity Gb pixels included in a 2×2 pixel region of the same color, for example, a 2×2 pixel region 611 to be a Gb pixel region of an upper left end illustrated in FIG. 28 and a pixel value of one pixel 621 of an output image 620 illustrated in FIG. 28(B) is calculated.

An operation process in the modification of the sixth embodiment is the same as the process of the sixth embodiment described above and is executed as a process for calculating a pixel value of an output image from each pixel value of the high sensitivity pixels and the low sensitivity pixels of the same color included in the 2×2 pixels.

[4. Summary of Configuration According to Present Disclosure]

The present disclosure has been described in detail with reference to the specific embodiments. However, it is apparent that those skilled in the art may find modifications and alternations of the embodiments without departing from the scope of the present disclosure. That is, the present invention is disclosed in an exemplary form and thus, it should be noted that the present invention is not analyzed to be limited. To determine the scope of the present invention, it is necessary to take claims into consideration.

In addition, the technology disclosed in the present specification may take the following configurations.

(1) An image processing apparatus including:
a control unit that executes exposure time control in units of pixels or pixel regions;
a pixel unit that outputs pixel information of a plurality of different exposure times by an imaging process under control of the control unit; and
a pixel information combining unit that inputs the pixel information of the plurality of different exposure times output by the pixel unit, executes an operation process using the plurality of pixel information, and calculates a pixel value of an output image,
wherein the pixel unit outputs high sensitivity pixel information obtained by adding pixel values of a plurality of high sensitivity pixels set on the basis of exposure control of the control unit and low sensitivity pixel information obtained by adding pixel values of a plurality of low sensitivity pixels, and
the pixel information combining unit executes a weight addition process of the high sensitivity pixel information and the low sensitivity pixel information and calculates a pixel value of an output image.

(2) The image processing apparatus according to the item (1),
wherein the control unit executes the exposure time control in units of columns of the pixel unit and the pixel unit outputs high sensitivity pixel information obtained by adding pixel values of a plurality of different high sensitivity pixels of a high sensitivity pixel column in which long time exposure is performed and low sensitivity pixel information obtained by adding pixel values of a plurality of different low sensitivity pixels of a low sensitivity pixel column in which short time exposure is performed.

(3) The image processing apparatus according to the item (1) or (2),
wherein the pixel information combining unit executes an addition process in which weights according to brightness of a subject are set to high sensitivity pixel information input from a long time exposure region and low sensitivity pixel information input from a short time exposure region, in a calculation process of the pixel value of the output image.

(4) The image processing apparatus according to any of the items (1) to (3),
wherein, when high sensitivity pixel information input from a long time exposure region is equal to or more than a predetermined threshold value, the pixel information combining unit calculates the pixel value of the output image by an operation process in which a weight of the high sensitivity pixel information is set to zero or a small value and only low sensitivity pixel information input from a short time exposure region is used or the weight is set to a large value.

(5) The image processing apparatus according to any of the items (1) to (4),
wherein, when low sensitivity pixel information input from a short time exposure region is less than a predetermined threshold value, the pixel information combining unit calculates the pixel value of the output image by an operation process in which a weight of the low sensitivity pixel information is set to zero or a small value and only high sensitivity pixel information input from a long time exposure region is used or the weight is set to a large value.

(6) The image processing apparatus according to any of the items (1) to (5),
wherein the control unit executes exposure time control of units of columns, by shutter control of units of columns of the pixel unit.

(7) The image processing apparatus according to any of the items (1) to (6),
wherein the control unit executes exposure time control in which a long time exposure region and a short time exposure region are alternately set in units of two columns of the pixel unit and the pixel unit outputs high sensitivity pixel information obtained by adding pixel values of a plurality of pixels included in the long time exposure region and low sensitivity pixel information obtained by adding pixel values of a plurality of pixels included in the short time exposure region.

(8) The image processing apparatus according to any of the items (1) to (7), further including:
a gradation converter that executes a bit reduction process of a pixel value of each pixel of the output image generated by the pixel information combining unit.

(9) The image processing apparatus according to any one of the items (1) to (8), further including:
a signal processing unit that executes a signal process for the output image generated by the pixel information combining unit.

(10) The image processing apparatus according to any of the items (1) to (9), further including:
a codec that executes an encoding process for the output image generated by the pixel information combining unit.

(11) The image processing apparatus according to any of the items (1) to (10),
wherein the control unit executes exposure time control in units of pixels of the pixel unit and the pixel unit outputs high sensitivity pixel information obtained by adding pixel values of a plurality of different high sensitivity pixels in which long time exposure is performed and low sensitivity pixel information obtained by adding pixel values of a plurality of different low sensitivity pixels in which short time exposure is performed.

(12) The image processing apparatus according to any of the items (1) to (11),
wherein the pixel unit outputs high sensitivity pixel information obtained by adding pixel values of two high sensitivity pixels which are included in a 2×2 pixel region and in which the long time exposure is performed and outputs low sensitivity pixel information obtained by adding pixel values of two low sensitivity pixels which are included in the 2×2 pixel region and in which the short time exposure is performed.

(13) The image processing apparatus according to any one of the items (1) to (12),
wherein the pixel unit has a Bayer array.

A method of the processes executed in the apparatuses described above and a program for causing the processes to be executed are also included in the configuration of the present disclosure.

In addition, the series of processes described in the specification can be executed by hardware, software, or a composite configuration of both the hardware and the software. When the processes are executed by the software, a program having a process sequence recorded therein can installed in a memory in a computer embedded in dedicated hardware and can be executed or the program can be installed in a general-purpose computer in which various processes can be executed and can be executed. For example, the program can be recorded on a recording medium in advance. In addition to installation of the program from the recording medium to the computer, the program can be received through a network such as a local area network (LAN) and the Internet and the can be installed in a recording medium such as an embedded hard disk.

The various processes described in the specification are not limited to only being executed in time series according to the description and may be executed in parallel or individually, according to the processing capability of the apparatus executing the processes or necessity. In addition, the system in the present specification means a logical aggregate structure of a plurality of apparatuses and is not limited to a structure in which an apparatus of each configuration is in the same casing.

INDUSTRIAL APPLICABILITY

As described above, according to one embodiment of the present disclosure, an apparatus and a method that can efficiently generate a wide dynamic range image to which each pixel information of a high sensitivity pixel and a low sensitivity pixel is applied are realized.

Specifically, high sensitivity pixel information obtained by adding pixel values of a plurality of high sensitivity pixels and low sensitivity pixel information obtained by adding pixel values of a plurality of low sensitivity pixels are output as output pixel signals from pixels of different sensitivities from a pixel unit, these pixel information are combined in a pixel information combining unit, an output pixel value is determined, and an output image of a wide dynamic range is output. In the pixel information combining unit, a weight for the high sensitivity pixel information or the low sensitivity pixel information is changed according to brightness of a subject, weight addition of the high sensitivity pixel information and the low sensitivity pixel information is performed, a pixel value of an output image is determined, and the pixel value is output.

According to one embodiment of the present disclosure, a plurality of pixels of different sensitivities are arranged in a pixel unit and pixel information in which resolution is lowered is generated from the plurality of pixels of the different sensitivities. As a result, a wide dynamic range image can be generated without needing a frame memory. In addition, because analog addition between the same sensitivities is enabled, a frame rate can be increased.

REFERENCE SIGNS LIST

10 Brightness threshold level
11 High brightness region
12 Low brightness region
101 Optical lens
102 Imaging device
103 Signal processing unit
105 Control unit
120 Output image
151 Pixel unit
160 Operation unit
161 AD converter
162 Pixel information combining unit
163 Output unit
181 High sensitivity pixel information
182 Low sensitivity pixel information
401 Gradation converter
402 Signal processing unit
403 Codec

The invention claimed is:

1. An image processing apparatus comprising:
a control unit that executes exposure time control in units of pixels or pixel regions;
a pixel unit that outputs pixel information of a plurality of different exposure times by an imaging process under control of the control unit; and
a pixel information combining unit that inputs the pixel information of the plurality of different exposure times output by the pixel unit, executes an operation process using the plurality of pixel information, and calculates a pixel value of an output image,
wherein the pixel unit outputs high sensitivity pixel information obtained by separately adding pixel values of a plurality of high sensitivity pixels set on the basis of exposure control of the control unit and low sensitivity pixel information obtained by separately adding pixel values of a plurality of low sensitivity pixels, and
the pixel information combining unit executes a weight addition process of the separately added high sensitivity pixel information and the separately added low sensitivity pixel information and calculates a pixel value of an output image.

2. The image processing apparatus according to claim 1, wherein the control unit executes the exposure time control in units of columns of the pixel unit, and
the pixel unit outputs high sensitivity pixel information obtained by adding pixel values of a plurality of different high sensitivity pixels of a high sensitivity pixel column in which long time exposure is performed and low sensitivity pixel information obtained by adding pixel values of a plurality of different low sensitivity pixels of a low sensitivity pixel column in which short time exposure is performed.

3. The image processing apparatus according to claim 1, wherein the pixel information combining unit executes an addition process in which weights according to brightness of a subject are set to high sensitivity pixel information input from a long time exposure region and low sensitivity pixel information input from a short time exposure region, in a calculation process of the pixel value of the output image.

4. The image processing apparatus according to claim 1, wherein, when high sensitivity pixel information input from a long time exposure region is equal to or more than a predetermined threshold value, the pixel information combining unit calculates the pixel value of the output image by an operation process in which a weight of the high sensitivity pixel information is set to zero or a small value and only low sensitivity pixel information input from a short time exposure region is used or a weight of the low sensitivity pixel information is set to a large value.

5. The image processing apparatus according to claim 1, wherein, when low sensitivity pixel information input from a short time exposure region is less than a predetermined threshold value, the pixel information combining unit calculates the pixel value of the output image by an operation process in which a weight of the low sensitivity pixel information is set to zero or a small value and only high sensitivity pixel information input from a long time exposure region is used or a weight of the high sensitivity pixel information is set to a large value.

6. The image processing apparatus according to claim 1, wherein the control unit executes exposure time control of units of columns, by shutter control of units of columns of the pixel unit.

7. The image processing apparatus according to claim 1, wherein the control unit executes exposure time control in which a long time exposure region and a short time exposure region are alternately set in units of two columns of the pixel unit, and
the pixel unit outputs high sensitivity pixel information obtained by adding pixel values of a plurality of pixels included in the long time exposure region and low sensitivity pixel information obtained by adding pixel values of a plurality of pixels included in the short time exposure region.

8. The image processing apparatus according to claim 1, further comprising:
a gradation converter that executes a bit reduction process of a pixel value of each pixel of the output image generated by the pixel information combining unit.

9. The image processing apparatus according to claim 1, further comprising:
a signal processing unit that executes a signal process for the output image generated by the pixel information combining unit.

10. The image processing apparatus according to claim 1, further comprising:
a codec that executes an encoding process for the output image generated by the pixel information combining unit.

11. The image processing apparatus according to claim 1, wherein the control unit executes exposure time control in units of pixels of the pixel unit, and
the pixel unit outputs high sensitivity pixel information obtained by adding pixel values of a plurality of different high sensitivity pixels in which long time exposure is performed and low sensitivity pixel information obtained by adding pixel values of a plurality of different low sensitivity pixels in which short time exposure is performed.

12. The image processing apparatus according to claim 11, wherein the pixel unit outputs high sensitivity pixel information obtained by adding pixel values of two high sensitivity pixels which are included in a 2×2 pixel region and in which the long time exposure is performed and outputs low sensitivity pixel information obtained by adding pixel values of two low sensitivity pixels which are included in the 2×2 pixel region and in which the short time exposure is performed.

13. The image processing apparatus according to claim 1, wherein the pixel unit has a Bayer array.

14. An imaging apparatus comprising:
an imaging unit; and
an image processing unit configured to:
execute exposure time control in units of pixels or pixel regions;
output a plurality of pixel information of a plurality of different exposure times by an imaging process;
execute an operation process using the plurality of pixel information; and
calculate a pixel value of an output image,
wherein outputting pixel information comprises outputting high sensitivity pixel information obtained by separately adding pixel values of a plurality of high sensitivity pixels set on the basis of the exposure time control and low sensitivity pixel information obtained by separately adding pixel values of a plurality of low sensitivity pixels, and
wherein the operation process comprises executing a weight addition process of the separately added high sensitivity pixel information and the separately added low sensitivity pixel information.

15. An image processing method that is executed in an image processing apparatus, comprising:
a control step of causing a control unit to execute exposure time control in units of pixels or pixel regions;
a pixel information output step of causing a pixel unit to output pixel information of a plurality of different exposure times by an imaging process under control of the control unit; and
a pixel information combination step of causing a pixel information combining unit to input the pixel information of the plurality of different exposure times output by the pixel unit, execute an operation process using the plurality of pixel information, and calculate a pixel value of an output image,
wherein the pixel information output step is a step of outputting high sensitivity pixel information obtained by separately adding pixel values of a plurality of high sensitivity pixels set on the basis of the exposure time control executed by the control unit and low sensitivity pixel information obtained by separately adding pixel values of a plurality of low sensitivity pixels, and
the pixel information combination step is a step of executing a weight addition process of the separately added high sensitivity pixel information and the separately added low sensitivity pixel information and calculating a pixel value of an output image.

16. A non-transitory computer-readable storage device having stored thereon instructions which, when executed by a processor, implement an image processing method comprising:
a control step of causing a control unit to execute exposure time control in units of pixels or pixel regions, a pixel information output step of causing a pixel unit to output pixel information of a plurality of different exposure times by an imaging process under control of the control unit, and a pixel information combination step of causing a pixel information combining unit to input the pixel information of the plurality of different exposure times output by the pixel unit, execute an operation process using the plurality of pixel information, and calculate a pixel value of an output image,
wherein in the pixel information output step, high sensitivity pixel information obtained by separately adding pixel values of a plurality of high sensitivity pixels set on the basis of the exposure time control executed by the control unit and low sensitivity pixel information obtained by separately adding pixel values of a plurality of low sensitivity pixels are output, and
wherein in the pixel information combination step, a weight addition process of the separately added high sensitivity pixel information and the separately added low sensitivity pixel information is executed and a pixel value of an output image is calculated.

* * * * *